United States Patent
Wen et al.

(10) Patent No.: US 11,921,963 B2
(45) Date of Patent: Mar. 5, 2024

(54) TOUCH STRUCTURE, TOUCH DISPLAY STRUCTURE, AND TOUCH DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ping Wen, Beijing (CN); Shun Zhang, Beijing (CN); Yi Zhang, Beijing (CN); Tingliang Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,020

(22) PCT Filed: Aug. 10, 2021

(86) PCT No.: PCT/CN2021/111814
§ 371 (c)(1),
(2) Date: Jun. 24, 2022

(87) PCT Pub. No.: WO2022/052715
PCT Pub. Date: Mar. 17, 2022

(65) Prior Publication Data
US 2022/0357816 A1 Nov. 10, 2022

(30) Foreign Application Priority Data
Sep. 8, 2020 (CN) .......................... 202010934004.2

(51) Int. Cl.
*G06F 3/044* (2006.01)
*G09G 3/00* (2006.01)
(Continued)

(52) U.S. Cl.
CPC .......... *G06F 3/0446* (2019.05); *G06F 3/0445* (2019.05); *G09G 3/035* (2020.08);
(Continued)

(58) Field of Classification Search
CPC ................. G06F 3/0446; G06F 3/0445; G06F 2203/04107; G09G 3/035; G09G 2354/00;
(Continued)

(56) References Cited

U.S. PATENT DOCUMENTS 10,504,981 B2  12/2019  Ma
11,079,879 B1  8/2021  Li
(Continued)

FOREIGN PATENT DOCUMENTS

CN  105655378 A  6/2016
CN  110502152 A  11/2019
(Continued)

OTHER PUBLICATIONS

Machine translation of CN 110502152. (Year: 2023).*

*Primary Examiner* — Michael Pervan
(74) *Attorney, Agent, or Firm* — Scully, Scott, Murphy & Presser, P.C.

(57) ABSTRACT

A touch structure, a touch display substrate, and a touch display device. The touch structure includes a touch region and a peripheral region surrounding the touch region, wherein the touch region includes a first edge and a second edge opposite to each other, and a third edge and a fourth edge opposite to each other. The touch structure further includes a first touch electrode and a second touch electrode,
(Continued)

which are mutually crossed with and insulated from each other, and located in the touch region. The touch structure further includes a first touch trace and a second touch trace, located in the peripheral region. The first touch trace is electrically connected with the first touch electrode at the first edge and the second edge, respectively; the second touch trace is electrically connected with the second touch electrode at the third edge and the fourth edge, respectively.

20 Claims, 11 Drawing Sheets

(51) Int. Cl.
| | |
|---|---|
| H10K 50/844 | (2023.01) |
| H10K 59/12 | (2023.01) |
| H10K 59/40 | (2023.01) |
| H10K 77/10 | (2023.01) |
| H10K 102/00 | (2023.01) |

(52) U.S. Cl.
CPC .......... *H10K 50/844* (2023.02); *H10K 59/12* (2023.02); *H10K 59/40* (2023.02); *H10K 77/111* (2023.02); *G06F 2203/04107* (2013.01); *G09G 2354/00* (2013.01); *H10K 2102/311* (2023.02)

(58) Field of Classification Search
CPC ...... H10K 50/844; H10K 59/12; H10K 59/40; H10K 77/111; H10K 2102/311
See application file for complete search history.

(56) References Cited

U.S. PATENT DOCUMENTS

| | | | |
|---|---|---|---|
| 2017/0192566 A1* | 7/2017 | Ma | H10K 50/84 |
| 2020/0266261 A1* | 8/2020 | Xu | H01L 27/124 |
| 2020/0401274 A1* | 12/2020 | Moon | G06F 3/04164 |
| 2023/0078853 A1* | 3/2023 | Zhang | G06F 3/04164 |
| | | | 345/174 |

FOREIGN PATENT DOCUMENTS

| | | |
|---|---|---|
| CN | 110634411 A | 12/2019 |
| CN | 111048566 A | 4/2020 |
| CN | 111290661 A | 6/2020 |
| CN | 111596789 A | 8/2020 |

* cited by examiner

TOUCH STRUCTURE, TOUCH DISPLAY STRUCTURE, AND TOUCH DISPLAY DEVICE

CROSS-REFERENCE TO RELATED APPLICATIONS

The application is a national stage of PCT International Patent Application No. PCT/CN2021/111814, filed on Aug. 10, 2021, which claims priority to the Chinese Patent Application No. 202010934004.2, filed on Sep. 8, 2020, each of which is incorporated by reference herein in its entirety.

TECHNICAL FIELD

Embodiments of the present disclosure relate to a touch structure, a touch display substrate and a touch display device.

BACKGROUND

With the development of touch display technology, capacitive touch screen has been widely used in organic light emitting diode (OLED) display devices.

Capacitive touch screen is divided into mutual-capacitive touch screen and self-capacitive touch screen. In the mutual-capacitive touch screen, a transverse electrode and a longitudinal electrode are usually made on a surface of a substrate, and a capacitor is formed at the intersection of the transverse electrode and the longitudinal electrode. Upon a finger touching the screen, it affects the coupling between the two electrodes near the touch position, thus changing the capacitance between the two electrodes. According to the change of capacitance, the coordinates of the touch position can be calculated.

SUMMARY

An embodiment of the disclosure provides a touch structure, comprising: a touch region and a peripheral region surrounding the touch region, wherein the touch region comprises a first edge and a second edge opposite to each other, and a third edge and a fourth edge opposite to each other; a first touch electrode and a second touch electrode, which are mutually crossed with and insulated from each other, and located in the touch region; and a first touch trace and a second touch trace, located in the peripheral region, wherein the first touch trace is electrically connected with the first touch electrode at the first edge and the second edge, respectively; the second touch trace is electrically connected with the second touch electrode at the third edge and the fourth edge, respectively.

In some examples, the touch structure according to claim 1, further comprising: a first trace convergence region and a second trace convergence region, wherein the first trace convergence region and the second trace convergence region are located on a side of the second edge away from the first edge, and in an extending direction of the second edge, the first trace convergence region and the second trace convergence region are located between the third edge and the fourth edge, and the second trace convergence region is located on a side of the first trace convergence region away from the third edge, and a part of the first touch trace and a part of the second touch trace extend to the first trace convergence region, and another part of the first touch trace and another part of the second touch trace extend to the second trace convergence region.

In some examples, the first touch trace comprises: a first trace group and a second trace group connected to the first touch electrode at the first edge, the first trace group and the second trace group being separated at a roughly middle position of the first edge, and the first trace group extending from a side of the third edge to the first trace convergence region; the second trace group extending from a side of the fourth edge to the second trace convergence region; and a third trace group and a fourth trace group connected to the first touch electrode at the second edge, the third trace group and the fourth trace group being separated at a roughly middle position of the second edge, and the third trace group extending to the first trace convergence region; the fourth trace group extending to the second trace convergence region.

In some examples, the second touch trace comprises: a fifth trace group connected to the second touch electrode at the third edge, the fifth trace group extending from a side of the third edge to the first trace convergence region; and a sixth trace group connected to the second touch electrode at the fourth edge, the sixth trace group extending from a side of the fourth edge to the second trace convergence region.

In some examples, the fifth trace group is located between the first trace group and the third trace group in the first trace convergence region; the sixth trace group is located between the second trace group and the fourth trace group in the second trace convergence region.

In some examples, both the first touch trace and the second touch trace comprise two layers of conductive traces, the two layers of conductive traces of the first touch trace overlap and are electrically connected with each other, and the two layers of conductive traces of the second touch trace overlap and are electrically connected with each other.

In some examples, the touch structure further comprises an interlayer dielectric layer located between the two layers of conductive traces of the first touch trace and located between the two layers of conductive traces of the second touch trace, wherein the interlayer dielectric layer comprises a plurality of first via holes, the two layers of conductive traces of the first touch trace are electrically connected through the first via holes, and the two layers of conductive traces of the second touch trace are electrically connected through the first via holes.

In some examples, in the extending direction of the first touch trace or the second touch trace, the first via holes between the two layers of conductive traces of the first touch trace are arranged at intervals, the first via holes between the two layers of conductive traces of the second touch trace are arranged at intervals.

In some examples, in the extending direction of the first touch trace or the second touch trace, a distance between adjacent first via holes between the two layers of conductive traces of the first touch trace is about 500-1000 μm, and a distance between adjacent first via holes between the two layers of conductive traces of the second touch trace is about 500-1000 μm.

In some examples, the first touch electrode and the second touch electrode comprise mesh patterns in a touch mesh layer and a bridge line in a bridge layer, and the bridge line is configured to electrically connect the mesh patterns of the first touch electrode or the mesh patterns of the second touch electrode at an intersection of the first touch electrode and the second touch electrode, one of the two layers of conductive traces of the first touch trace is located in the bridge layer, and the other is located in the touch mesh layer; one of the two layers of conductive traces of the second touch trace is located in the bridge layer, and the other is located in the touch mesh layer.

In some examples, the touch structure further comprises a shielding line, which is located at a side of the first touch trace and the second touch trace away from the touch region.

In some examples, the touch structure further comprises a ground line, which is located at a side of the shielding line away from the touch region.

An embodiment of the disclosure further provides a touch display substrate, comprising the touch structure according to any one of the items mentioned above, and a display substrate, wherein the display substrate comprises an organic light emitting element and an encapsulation layer, and the touch structure is located on the encapsulation layer.

In some examples, the touch display substrate further comprises a bonding region located on a side of the second edge away from the touch region, and the first touch trace and the second touch trace being connected to the bonding region.

In some examples, the touch display substrate further comprises a bendable region located between the touch region and the bonding region, wherein at least one of the first touch trace and the second touch trace is disconnected at the bendable region to form a first end close to the touch region and a second end close to the bonding region, and the bendable region comprises a first metal connecting portion which is located at different layer from the first touch trace and the second touch trace and a second via hole, and the first end and the second end are connected with the first metal connecting portion through the second via hole, respectively.

In some examples, the touch display substrate further comprises a pixel driving circuit layer, wherein the pixel driving circuit layer comprises a thin film transistor, the thin film transistor comprises a source/drain electrode and a gate electrode, and the first metal connecting portion and the source/drain electrode of the thin film transistor are located on a same layer.

In some examples, the bendable region comprises a second metal connecting portion which is located on different layer from the first metal connecting portion and a third via hole, the second metal connecting portion is located on the same layer as the gate electrode of the thin film transistor, and the first metal connecting portion is disconnected into two parts at a position corresponding to the second metal connecting portion in the bendable region, and the two parts of the first metal connecting portion are respectively connected with the second metal connecting portion through the third via hole.

In some examples, the first metal connecting portion comprises an opening along a direction perpendicular to a layer where the first metal connecting portion is located.

In some examples, the organic light emitting element comprises an anode, an electroluminescent layer and a cathode which are sequentially stacked, and the first touch electrode and the second touch electrode are at least partially overlapped with the cathode.

In some examples, the touch display substrate further comprises a trace transition region located between the bendable region and the bonding region; a power line electrically connected with the anode or the cathode, at least part of the power line is located in the trace transition region, and the first touch trace and the second touch trace overlap with at least part of the power line located in the trace transition region.

In some examples, the touch display substrate further comprises a detection line located on a side of the ground line away from the touch region.

An embodiment of the disclosure further provides a touch display device, comprising the touch display substrate according to any one of the items mentioned above.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

Figure 1:
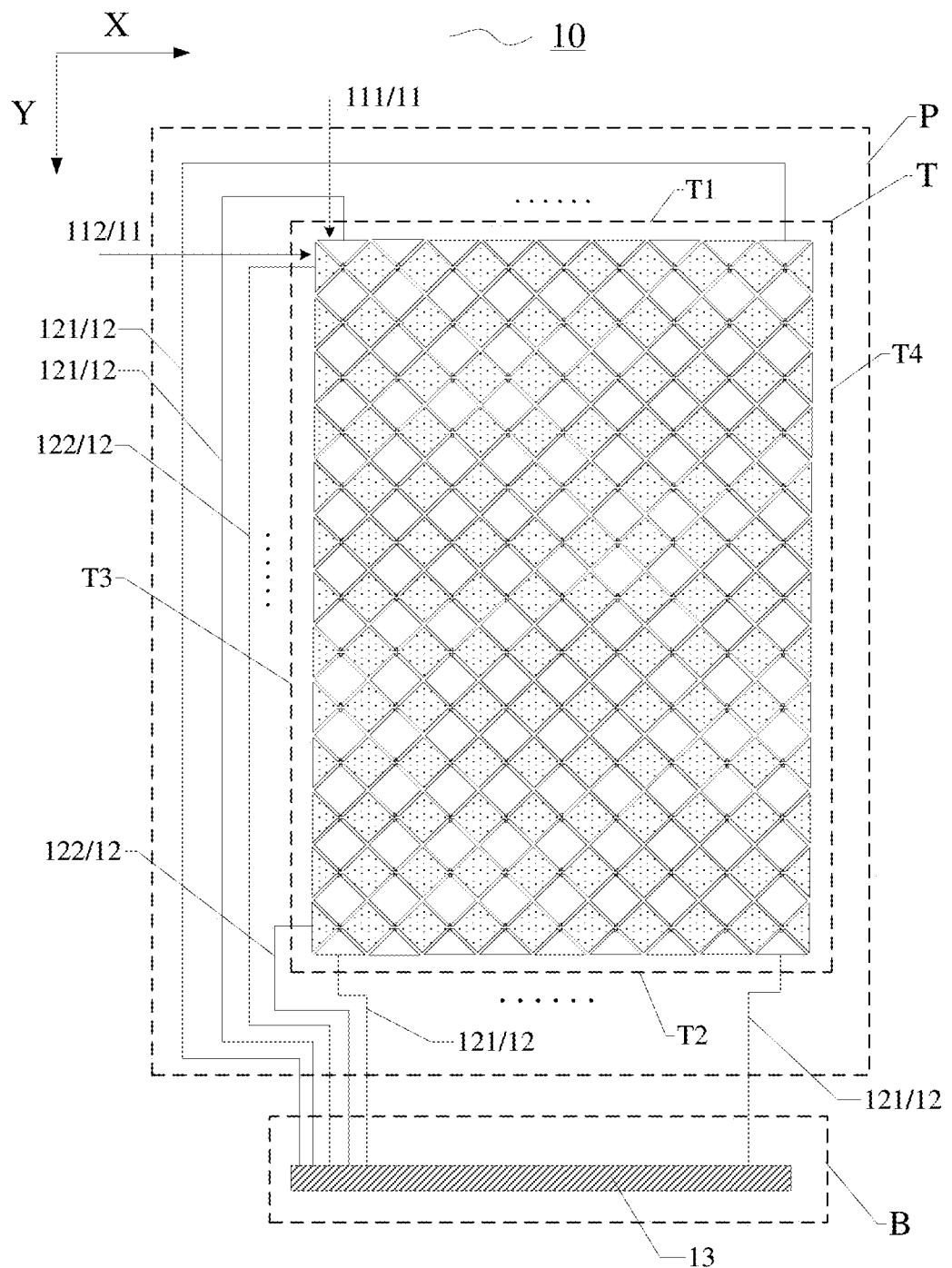
FIG. 1 is a schematic diagram of a touch structure.

FIG. 1 is a schematic diagram of a touch structure. As illustrated in FIG. 1, the touch structure 10 includes touch electrodes 11 and touch traces 12. The touch electrodes 11 are located in a touch region T and include a plurality of first touch electrodes 111 and a plurality of second touch electrodes 112 which are insulated from each other. The first touch electrodes 111 and the second touch electrodes 112 are crossed with each other. As illustrated in the figure, the first touch electrodes 111 extend along a Y direction, and the second touch electrodes 112 extend along a X direction, which intersects with the Y direction. The touch traces 12 are located in the peripheral region P (for example, around the touch region T) and include a plurality of first touch traces 121 and a plurality of second touch traces 122. The first touch traces 121 are connected to the first touch electrodes 111, and the second touch traces 122 are connected to the second touch electrodes 112.

As illustrated in FIG. 1, the upper and lower ends of each first touch electrode 111 are respectively connected to one first touch trace 121, respectively, and the left end of each second touch electrode 112 is connected to one second touch trace 122. The touch structure 10 further includes a bonding region B located at the lower side of the touch region T, and the bonding region B includes a touch driving chip 13. The first touch traces 121 and the second touch traces 122 are connected to the touch driving chip 13. The first touch electrode 111 can be used as a signal transmitting channel, and the second touch electrode 112 can be used as a signal receiving channel to realize the touch function.

However, in large-size touch display panels such as folding screens, because the length of touch traces is long, the signal attenuation of them is serious, which affects the refresh frequency and signal uniformity of touch display panels. Therefore, the above-mentioned touch structure can no longer meet the requirements of large-size touch display panels for touch performance.

Embodiments of the disclosure provide a touch structure, a manufacturing method thereof, a touch display substrate and a touch display device. The touch structure comprises a touch region and a peripheral region surrounding the touch region, first touch electrodes and second touch electrodes which are mutually crossed with and insulated from each other, and first touch traces and second touch traces which are mutually insulated from each other. The touch region includes a first edge and a second edge opposite to each other, and a third edge and a fourth edge opposite to each other. The first touch electrodes and the second touch electrodes are located in the touch region. The first touch traces and the second touch traces are located in the peripheral region. The first touch traces are connected with the first touch electrodes on the first edge and the second edge, respectively, and the second touch traces are connected with the second touch electrodes on the third edge and the fourth edge, respectively. The touch structure can be applied to large-size touch display panels to improve signal transmission speed, thus improving refresh frequency and signal uniformity.

For example, the touch structure can be applied to a large-sized folding screen. For example, as illustrated in FIG. 1, the diagonal length of the folding screen is greater than 8 inches, and its aspect ratio is about 8:7. According to the requirement for folding, its folding axis can be parallel to the X direction and located near the central axis of the panel, and its folding axis can also be parallel to the Y direction and located near the central axis of the panel. In this disclosure, the word "about" substantially refers to the value within the range of allowable process and measurement errors without strict limits. In some embodiments, the aspect ratio of the folding screen is 8:7.

Hereinafter, a touch structure, a manufacturing method thereof, a touch display substrate and a touch display device provided by embodiments of the disclosure will be described in detail with reference to the drawings.

Figure 2A:
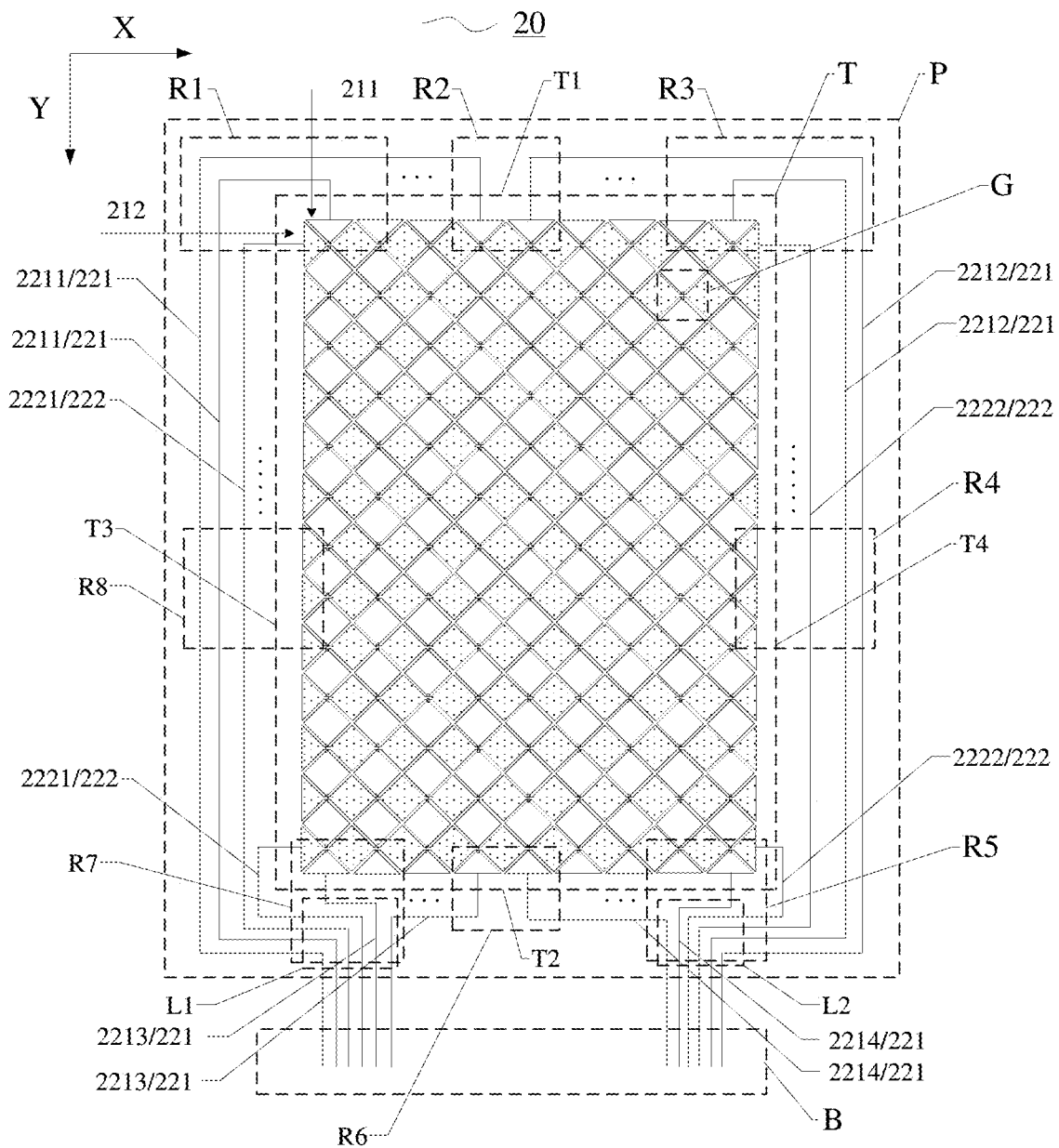
FIG. 2A is a schematic diagram of a touch structure according to an embodiment of the present disclosure.

An embodiment of the present disclosure provides a touch structure, and FIG. 2A is a schematic diagram of a touch structure. As illustrated in FIG. 2A, the touch structure 20 includes a touch region T and a peripheral region P surrounding the touch region T, first touch electrodes 211 and second touch electrodes 212 which are mutually crossed with and insulated from each other, and first touch traces 221 and second touch traces 222 which are mutually insulated from each other. The touch region T includes a first edge T1 and a second edge T2 opposite to each other, and a third edge T3 and a fourth edge T4 opposite to each other. The first touch traces 221 and the second touch traces 222 are located in the peripheral region P. The first touch traces 221 are connected to the first touch electrodes 211 at the first edge T1 and the second edge T2, respectively, and the second touch traces 222 are connected to the second touch electrodes 212 at the third edge T3 and the fourth edge T4, respectively.

For example, the first edge T1 and the second edge T2 are parallel to each other, and the third edge T3 and the fourth edge T4 are parallel to each other. The extending direction of the first edge T1 and the second edge T2 and the extending direction of the third edge T3 and the fourth edge T4 intersect with each other, for example, are perpendicular to each other.

Compared with the touch structure 10 illustrated in FIG. 1, both the first touch electrodes and the second touch electrodes of the touch structure 20 can be connected with touch traces at both ends, so that the transmission speed of touch signals can be increased, and the refresh frequency and signal uniformity can be improved. For example, the refresh rate of the touch display panel with the touch structure can be increased by more than 10%.

For example, the first touch traces 221 and the second touch traces 222 have a material including metal materials or alloy materials, and can be single-layer metal or multi-layer metal laminate. For example, both the first touch traces 221 and the second touch traces 222 can be made of titanium, aluminum and titanium three-layer metal laminate (Ti/Al/Ti).

For example, the number of the first touch electrode 211, the second touch electrode 212, the first touch trace 221 and the second touch trace 222 can be one or more. The embodiments of the disclosure are described by taking the number of each of the first touch electrode 211, the second touch electrode 212, the first touch trace 221 and the second touch trace 222 being more than one as an example. To simplify the drawings, a part of the touch electrodes and the touch traces are schematically illustrated in FIG. 2A.

For example, as illustrated in FIG. 2A, the first touch electrodes 211 extend along the Y direction, and the second touch electrodes 212 extend along the X direction, which intersects with the Y direction. It should be noted that the first touch electrodes 211 and the second touch electrodes 212 may also extend along directions that have certain included angles with the X and Y directions, respectively.

For example, the first edge T1 and the second edge T2 extend along the X direction, and the third edge T3 and the fourth edge T4 extend along the Y direction.

For example, as illustrated in FIG. 2A, the touch structure 20 includes a first trace convergence region L1 and a second trace convergence region L2. The first trace convergence region L1 and the second trace convergence region L2 are located on the side of the second edge T2 away from the first edge T1. In the extending direction of the second edge T2, the first trace convergence region L1 and the second trace convergence region L2 are located between the third edge T3 and the fourth edge T4, and the second trace convergence region L2 is located on the side of the first trace convergence region L1 away from the third edge T3. In some examples, in the extending direction of the second edge T2, the first trace convergence region L1 is located between the end of the second edge T2 near the third edge T3 and the approximately middle position of the second edge T2, and the second trace convergence region L2 is located between the end of the second edge T2 near the fourth edge T4 and the approximately middle position of the second edge T2.

As illustrated in FIG. 2A, a part of the first touch traces 221 and a part of the second touch traces 222 extend to the first trace convergence region L1, and a part of the first touch traces 221 and a part of the second touch traces 222 extend to the second trace convergence region L2.

It should be noted that the end of the second edge T2 near the third edge T3 refers to the intersection point of the second edge T2 and the third edge T3; the approximate middle position of the second edge T2 refers to the approximate midpoint of the second edge, but is not limited to the absolute midpoint. At the approximate middle position of the second edge T2, the first touch traces 221 converge to the left and right edges respectively. For example, FIG. 2A illustrates nine first touch electrodes 211 extending along the Y direction. Among the first touch traces 221 located on one side of the second edge T2, four left first touch traces 221 converge to the first trace convergence region L1 and five right first touch traces 221 converge to the second trace convergence region L2. In this case, the approximate middle position of the second edge T2 is located between the lower end of the fourth first touch trace 221 and the fifth first touch trace. FIG. 2A is only an example, and embodiments of the present disclosure are not limited thereto. For example, the approximately middle position of the second edge T2 may be located between the lower end of the third first touch trace 221 and the lower end of the fourth first touch trace 221. Alternatively, the number of the first touch electrodes 211 may be greater than or less than 9.

For example, as illustrated in FIG. 2A, the first touch traces 221 include a first trace group 2211 and a second trace group 2212 both connected to the first touch electrode 211 at the first edge T1. The first trace group 2211 and the second trace group 2212 are separated at approximately the middle of the first edge T1. As illustrated in FIG. 2A, the first trace group 2211 is located on the left side of the approximately middle position of the first edge T1, and the second trace group 2212 is located on the right side of the approximately middle position of the first edge T1. The first trace group 2211 extends from the side where the third edge T3 is located to the first trace convergence region L1. The second trace group 2212 extends from the side where the fourth edge T4 is located to the second trace convergence region L2. The meaning of the approximately middle position of the first edge T1 is similar to that of the approximately middle position of the second edge T2, which will not be described here.

As illustrated in FIG. 2A, the first touch trace 221 further includes a third trace group 2213 and a fourth trace group 2214 both connected to the first touch electrode 211 at the second edge T2. The third trace group 2213 and the fourth trace group 2214 are separated at the approximately middle position of the second edge T2. As illustrated in FIG. 2A, the third trace group 2213 is located on the left side of the approximately middle position of the second edge T2, and the fourth trace group 2214 is located on the right side of the approximately middle position of the second edge T2. The first touch traces 221 of the third trace group 2213 extend to the first trace convergence region L1, and the first touch traces 221 of the fourth trace group 2214 extend to the second trace convergence region L2. The third trace group 2213 extends from the middle position of the second edge T2 and the end of the second edge T2 near the third edge T3 to the first trace convergence region L1. The fourth trace group 2214 extends from the middle position of the second edge T2 and the end of the second edge T2 near the fourth edge T4 to the second trace convergence region L2. In an embodiment of the present disclosure, each trace group includes at least one touch trace.

It should be noted that along the extending direction of the second edge T2, the positions of the first trace convergence region L1 and the second trace convergence region L2 can be adjusted according to actual needs. For example, the first trace convergence region L1 may also be located at the end of the second edge T2 near the third edge T3, and correspondingly, the third trace group 2213 may extend from the middle of the second edge T2 to the first trace convergence region L1. For example, the second trace convergence region L2 may also be located at the end of the second edge T2 near the fourth edge T4, and correspondingly, the fourth trace group 2214 may extend from the middle of the second edge T2 to the second trace convergence region L2. This disclosure is not limited to this.

For example, as illustrated in FIG. 2A, the second touch traces 222 include a fifth trace group 2221 connected to the second touch electrode 212 at the third edge T3, and the fifth trace group 2221 extends to the first trace convergence region L1 along the third edge T3 in a direction close to the second edge T2.

As illustrated in FIG. 2A, the second touch trace 222 further includes a sixth trace group 2222 connected to the second touch electrode 212 at the fourth edge T4, and the sixth trace group 2222 extends to the second trace convergence region L2 along the fourth edge T4 in a direction close to the second edge T2.

For example, as illustrated in FIG. 2A, in the first trace convergence region L1, the fifth trace group 2221 is located between the first trace group 2211 and the third trace group 2213. In the second trace convergence region L2, the sixth trace group 2222 is located between the second trace group 2212 and the fourth trace group 2214. Of course, FIG. 2A is only an example, and the positions of the above-mentioned different trace groups can also be interchanged, which is not limited by this disclosure. For example, in the first trace convergence region L1, the first trace group 2211 is located between the fifth trace group 2221 and the third trace group 2213, or the third trace group 2213 is located between the first trace group 2211 and the fifth trace group 2221. For example, in the second trace convergence region L2, the second trace group 2212 is located between the sixth trace group 2222 and the fourth trace group 2214, or the fourth trace group 2214 is located between the second trace group 2212 and the sixth trace group 2222.

By setting the first trace convergence region and the second trace convergence region, the space utilization rate of the first touch traces and the second touch traces is improved.

For example, as illustrated in FIG. 2A, the touch structure 20 further includes a bonding region B, which is located at the lower side of the first trace convergence region L1 and the second trace convergence region L2. The first touch traces 221 and the second touch traces 222 are connected to the bonding region B. For example, the first touch electrodes 211 can be used as a signal transmitting channel, the second touch electrodes 212 can be used as a signal receiving channel, or the second touch electrode 212 can be used as a signal transmitting channel and the first touch electrode 211 can be used as a signal receiving channel.

For example, as illustrated in FIG. 2A, the first touch electrodes 211 and/or the second touch electrodes 212 may be an electrode formed by a metal mesh, and the material of the first touch electrodes 211 and/or the second touch electrodes 212 may be metal, for example, Argentum (Ag), Cuprum (Cu) and Titanium, Aluminum and Titanium three-layer metal laminate (Ti/Al/Ti).

Figure 2B:
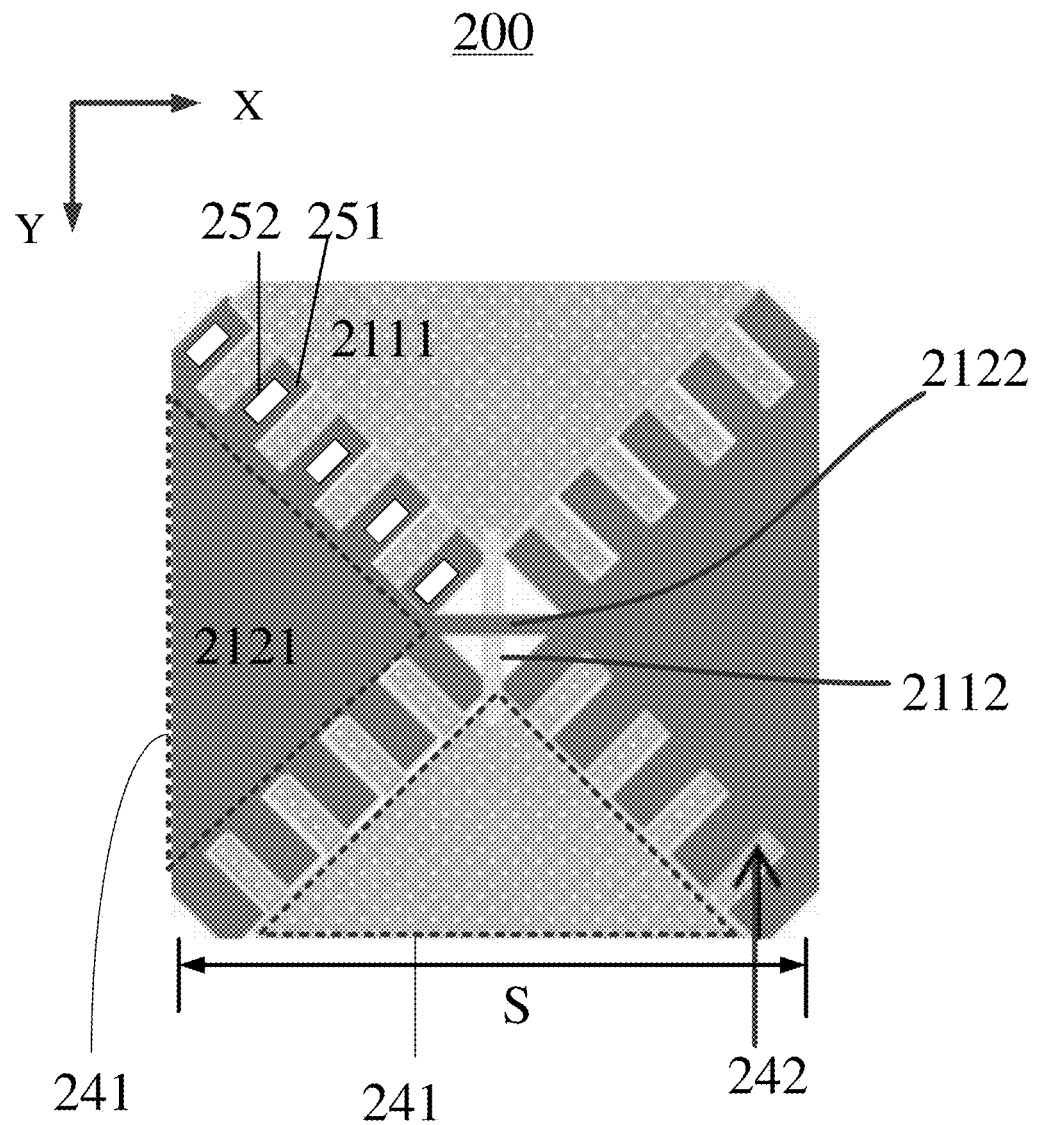
FIG. 2B is an enlarged structural diagram of region G in FIG. 2A.

FIG. 2B is an enlarged structural diagram of the region G in FIG. 2A, schematically illustrating the structure of the intersection of the first touch electrode 211 and the second touch electrode 212.

As illustrated in FIG. 2B, each first touch electrode 211 includes first touch electrode portions 2111 arranged in sequence and in series along the Y direction, and each second touch electrode 212 includes second touch electrode portions 2121 arranged in sequence and in series along the X direction. FIG. 2B illustrates only a part of each of two first touch electrode portion 2111 and two second touch electrode portion 2121. As illustrated in FIG. 2A, the outer contours of each of the first touch electrode portion 2111 and the second touch electrode portion 2121 are generally diamond-shaped block. In other examples, the outer contours of the first touch electrode portion 2111 and the second touch electrode portion 2121 may be other shapes, such as triangular shapes, bar shapes, etc.

As illustrated in FIG. 2B, the touch structure 20 further includes a first connecting portion 2112 and a second connecting portion 2122. The first touch electrode portions 2111 adjacent to each other in the Y direction are electrically connected by the first connecting portion 2112 to form the first touch electrode 211. The second touch electrode portions 2121 adjacent to each other in the X direction are electrically connected by the second connecting portions 2122 to form the second touch electrode 212.

Each first touch electrode 211 and each second touch electrode 212 are insulated from and crossed with each other, and a plurality of touch units 200 are formed at the intersections therebetween. Each touch unit 200 includes a part of both two first touch electrode portions 2111 connected at the intersection and at least a part of both two second touch electrode portions 2121 connected at the intersection. FIG. 2B illustrates an enlarged schematic diagram of a touch unit 200. As illustrated in FIG. 2B, each touch unit 200 includes half region of both two adjacent first touch electrode portions 2111 and half region of both two adjacent second touch electrode portions 2121, that is to say, each touch unit 200 includes one first touch electrode portion 2111 and one second touch electrode portion 2121 on average. The intersection of the first touch electrode portion 2111 and the second touch electrode portion 2121 in each touch unit 200 (that is to say, the intersection of the first connecting portion 2112 and the second connecting portion 2122) form a reference point for calculating coordinates. Upon a finger touching the touch screen containing the touch structure, it affects the coupling between the first touch electrode and the second touch electrode of the touch point nearby, thus changing the mutual capacitance between the two electrodes. According to the capacitance variation data of the touch screen, the coordinates of each touch point can be calculated based on the reference point. For example, the area of each touch unit 200 is comparable with the touch area that a person's finger touches the touch panel. If the area of the touch unit is too large, a touch blind spot may appear on the panel, and if it is too small, a false touch signal may be caused.

As illustrated in FIG. 2B, the average side length of each touch unit 200 is S, which is called the Pitch of the touch structure 20. For example, the size range of the pitch S is about 3.7 mm-5 mm, such as about 4 mm; this is because the diameter of a person's finger touching the touch panel is about 4 mm. For example, the pitch is the same as the average side length of each first touch electrode portion 2111 and the average side length of each second touch electrode portion 2121, and is also the same as the center distance between adjacent first touch electrode portions 2111 and adjacent second touch electrode portions 2121.

For example, as illustrated in FIG. 2B, the first touch electrode portion 2111 and the second touch electrode portion 2121 respectively include a main body portion 241 and a plurality of interdigital portions 242 protruding from the main body portion 241, and the interdigital portions 242 of the first touch electrode portion 2111 and the interdigital portions 242 of the adjacent second touch electrode portion 2121 are arranged in the same layer in an insulated manner and nested arrangement. In other examples, the edge of the diamond-shaped block has an interdigital structure, and both sides of the interdigital structure have notches, which can be regular or irregular.

The interdigital portions 242 can increase the perimeter of the first touch electrode portion 2111 and/or the second touch electrode portion 2121 upon keeping the same area of the touch electrode portion, so that the mutual capacitance can be effectively increased without increasing the self-capacitance (capacitive load) of the first touch electrode portion and/or the second touch electrode portion, thereby improving the touch sensitivity. For example, the shape of the main body portion 241 may be circular or polygonal (e.g., rectangular or diamond), and the shape of the interdigital portion 242 includes at least one of the following shapes: parallelogram (e.g., rectangular), triangle, trapezoid, hexagon, semicircle; that is to say, the outer contour of the first touch electrode portion and/or the second touch electrode portion may be zigzag, wavy, etc.

For example, the plurality of interdigital portions 242 are distributed around the main body portion 241 of the first touch electrode portion and/or the second touch electrode portion. For example, the main body portion 241 is rectangular, and the number of interdigital portions 242 corresponding to each side is 3-10, such as 6-10. In other examples, the main body portion may also be circular, and a plurality of interdigital portions 242 are evenly distributed on the circumference of the circular shape.

As illustrated in FIG. 2B, at least one interdigital portion 242 of the first touch electrode portion 2111 includes a first finger effective electrode 251 and a first finger dummy electrode 252, the first finger dummy electrode 252 is insulated from the first finger effective electrode 251, and the first finger effective electrode 251 is connected with the main body portion 241 of the first touch electrode portion 2111. The first finger effective electrode 251 is a part of the first touch electrode portion 2111 that can be electrically connected effectively and has an effective detection function. For example, the first finger dummy electrode 252 is located inside the first finger effective electrode 251. For example, the first finger dummy electrode 252 is completely surrounded by the first finger effective electrode 251. Or, the first finger dummy electrode 252 is partially surrounded by the first finger effective electrode 251, for example, at least one side of the first finger dummy electrode 252 may not be directly adjacent to the first finger effective electrode 251, for example, at least one side of the first finger dummy electrode 252 may be adjacent to the main body portion 241 of the first touch electrode 2111. For example, the first finger dummy electrode 252 may also be connected to a dummy electrode located in the main body portion 241 of the first touch electrode 2111. The embodiments of the disclosure are not limited to this. For example, the first finger dummy electrode 252 and the first finger effective electrode 251 are arranged in the same layer and insulated from each other, which can be regarded as a hollow region in the first finger effective electrode 251, and the first finger dummy electrode 252 is located in the hollow region and spaced from the first finger effective electrode 251.

For example, the first finger dummy electrode 252 and the first finger effective electrode 251 respectively include a plurality of metal meshes, and they are insulated from each other by a break in a metal line.

It should be noted that "same layer" arrangement in this disclosure means that two or more structures are formed by the same film layer through the same or different patterning processes, so the materials are the same.

For example, the first finger dummy electrode 252 is spaced from the main body portion 241.

For example, the first finger dummy electrode 252 is in a floating state, that is to say, it is not electrically connected to other structures or receives any electrical signals.

For example, the outer contour of the first finger dummy electrode 252 may be a regular shape (e.g., rectangle, diamond, etc.) or an irregular shape.

For example, the outer contour refers to a shape obtained by connecting the ends of the first finger dummy electrode 252.

This disclosure does not limit the structures of the first touch electrodes and the second touch electrodes. For example, in some embodiments, the first touch electrode 211 and/or the second touch electrode 212 may be a pattern formed by connecting a plurality of rectangular blocks, and the material of the first touch electrode 211 and/or the second touch electrode 212 may be a transparent conductive material, such as ITO.

In some embodiments, dummy electrodes may also be provided inside the first touch electrode portion 2111 and/or the second touch electrode portion 2121. The dummy electrodes are insulated from the first touch electrode portions 2111 or the second touch electrode portions 2121, and are provided with the same layer and the same material. The shape, size and outer contour of the dummy electrodes can be made according to the design requirements.

For example, both the first touch traces 221 and the second touch traces 222 include two layers of conductive traces. Two layers of conductive traces of the first touch traces 221 are overlapped and electrically connected, and two layers of conductive traces of the second touch traces 222 are also overlapped and electrically connected. Both the first touch traces and the second touch traces are connected in parallel by two layers of conductive traces, which can reduce the signal attenuation on the touch trace and improve the touch effect. The following cross-sectional view of the first touch traces is taken as an example for description.

Figure 3:
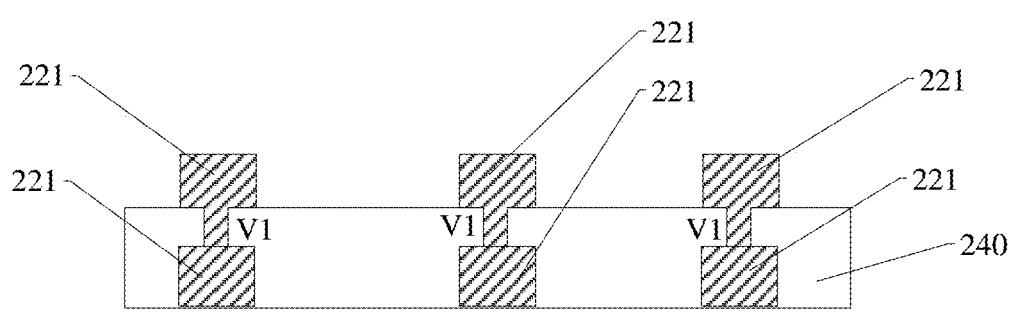
FIG. 3 is a cross-sectional schematic diagram of a first touch trace according to an embodiment of the present disclosure.

FIG. 3 is a cross-sectional schematic diagram of first touch traces, illustrating three first touch traces 221. As illustrated in FIG. 3, the touch structure 20 further includes an interlayer dielectric layer 240 located between two layers of conductive traces of the first touch traces 221. The interlayer dielectric layer 240 includes a plurality of first via holes V1, and the two layers of first touch traces 221 are electrically connected through the first via holes V1.

For example, the interlayer dielectric layer 240 may be an inorganic thin film, for example, its material may be an inorganic oxide such as SiNx, SiOx, SiOxNy, etc. For example, the first via holes V1 may be via holes filled with titanium, aluminum and titanium three-layer metal stack (Ti/Al/Ti).

The cross-sectional structures of the second touch traces and the first touch traces are similar. For example, two layers of the second touch traces are respectively arranged on the same layer as two layers of the first touch traces, that is to say, the interlayer dielectric layer 240 is also located between two layers of conductive traces of the second touch traces 222. Two layers of the second touch traces 222 can also be electrically connected through the first via holes V1.

Figure 4:
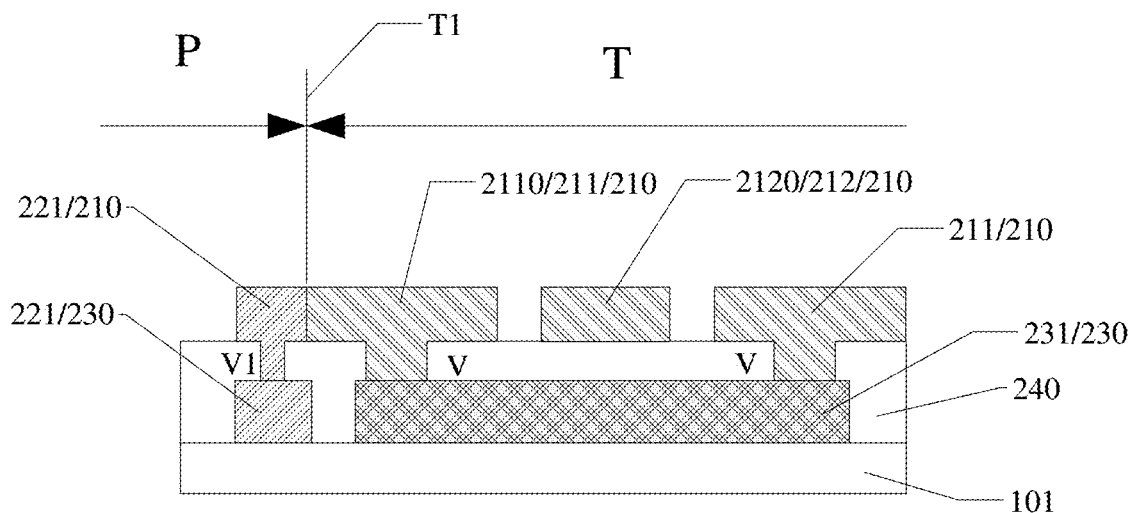
FIG. 4 is a schematic diagram of the cross-sectional structure at a first edge T1 in FIG. 2A.

FIG. 4 is a schematic diagram of the cross-sectional structure at the first edge T1 in FIG. 2A, illustrating the positional relationship between the two layers of first touch traces 221 and the first touch electrodes 211 in the direction perpendicular to the touch structure. For example, as illustrated in FIG. 4, the touch structure 20 includes a touch mesh layer 210 and a bridge layer 230. A mesh pattern 2110 of the first touch electrode 211 and a mesh pattern 2120 of the second touch electrode 212 are located in the touch mesh layer 210. For example, the mesh pattern 2110 of the first touch electrode 211 is a bar pattern composed of a plurality of rectangular grids, extending along the Y direction in FIG. 2A. For example, with reference to FIG. 2B, the mesh pattern 2110 of the first touch electrode 211 includes the first touch electrode portion 2111. The mesh pattern 2120 of the second touch electrode 212 is a bar pattern composed of a plurality of rectangular grids, extending along the X direction in FIG. 2A. For example, with reference to FIG. 2B, the mesh pattern 2110 of the second touch electrode 212 includes the second touch electrode portion 2121. For example, the rectangular grid of the mesh pattern 2110 of the first touch electrode 211 or the mesh pattern 2120 of the second touch electrode 212 is disconnected at the intersection of the first touch electrode 211 and the second touch electrode 212. The bridge layer 230 includes a bridge line 231 configured to electrically connect the mesh pattern 2110 of the first touch electrode 211 or the mesh pattern 2120 of the second touch electrode 212 at the intersection of the first touch electrode 211 and the second touch electrode 212. For example, the first connecting portion 2112 is located in the touch mesh layer 210, the second connecting portion 2122 is located in the bridge layer 230, and the second connecting portion 2122 can be used as the bridge line 231. Alternatively, the second connecting portion 2122 is located in the touch mesh layer 210, the first connecting portion 2112 is located in the bridge layer 230, and the first connecting portion 2112 can be used as the bridge line 231.

For example, as illustrated in FIG. 4, the first touch electrode 211 is disconnected at the intersection with the second touch electrode 212, and the bridge layer 230 is provided with a via hole V, and the first touch electrodes 211 on both sides of the disconnection are electrically connected to the bridge line 231 through the via hole V respectively, so as to achieve the bridging effect. Of course, it is also possible that the second touch electrode 212 is disconnected at the intersection with the first touch electrode 211, and the second touch electrodes 212 on both sides of the disconnection are electrically connected to the bridge line 231 through the via hole V, respectively.

For example, as illustrated in FIG. 4, the bridge layer 230 is located between the touch mesh layer 210 and the substrate 10. Of course, the bridge layer 230 can also be located on the side of the touch mesh layer 210 away from the substrate 10. The disclosure is not limited to this.

For example, as illustrated in FIG. 4, one of the two layers of first touch traces 221 is on the same layer as the bridge layer 230, and the other layer is on the same layer as the touch mesh layer 210.

By making the two layers of first touch traces 221 located on the touch mesh layer 210 and the bridge layer 230, respectively, it is unnecessary to set more metal layers, thus reducing the manufacturing process of the touch structure.

Similarly, the arrangement of the two layers of second touch traces 222 can also refer to FIG. 4, one layer of the two layers of the second touch traces 222 is located on the same layer as the bridge layer 230, and the other layer is located on the same layer as the touch mesh layer 210.

FIG. 2A illustrates eight regions R1-R8 of the touch structure 20, and FIG. 5-FIG. 9 are enlarged structural diagrams of R1-R5 regions, respectively. In addition, the structure of R6 can refer to R2, the structure of R7 can refer to R5, and the structure of R8 can refer to R4, and the embodiment of the present disclosure will not be described in the drawings.

The first via hole V1 may be arranged in a plurality of positions of the first touch traces 221 and the second touch traces 222. For example, FIG. 5, FIG. 8 and FIG. 9 respectively illustrate the arrangement positions of some first via holes V1.

Figure 8:
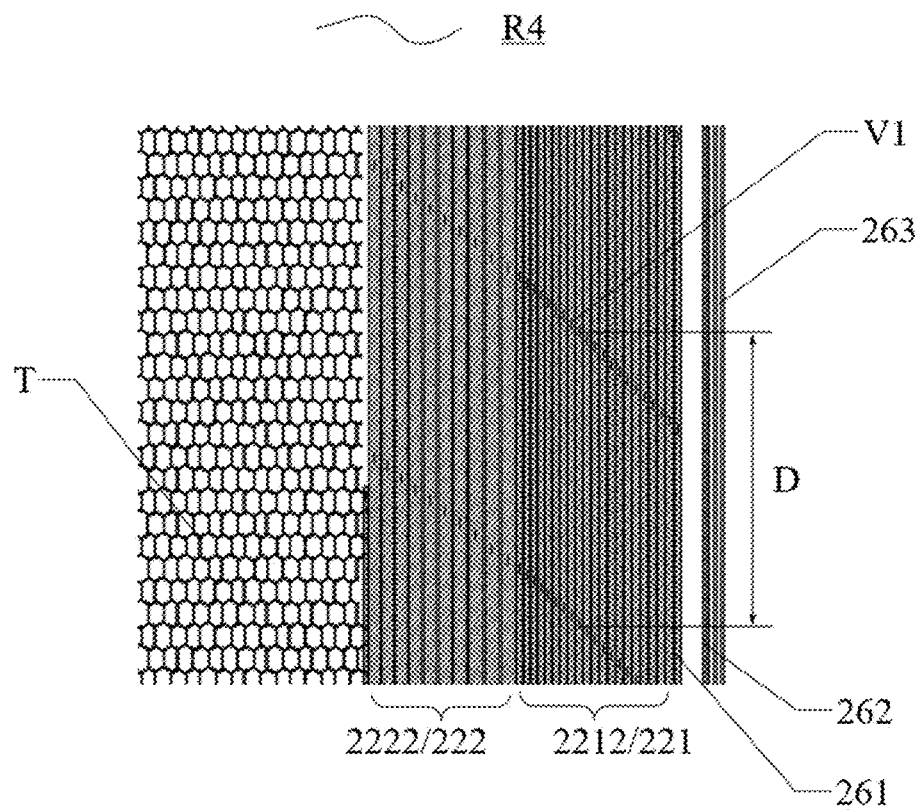
FIG. 8 is an enlarged structural diagram of region R4 in FIG. 2A.

For example, as illustrated in FIG. 8, in the extending direction of the first touch traces 221, the first via holes V1 located between two layers of conductive traces of the first touch traces 221 are arranged at intervals. In the extending direction of the second touch traces 222, the first via holes V1 located between the two layers of conductive traces of the second touch traces 222 are arranged at intervals. For example, in the extending direction of the first touch traces 221 or the second touch traces 222, the distance D between adjacent first via holes located between two layers of conductive traces of the first touch traces 221 may be about 500-1000 μm, and the distance between adjacent first via holes V1 located between two layers of conductive traces of the second touch traces 222 may be about 500-1000 μm. It should be noted that the upper and lower end values of the distance D are not strictly required to be 500 μm and 1000 μm, for example, the end values of 500 μm and 1000 μm can fluctuate by 10%. In some embodiments, in the extending direction of the first touch traces 221 or the second touch traces 222, the distance D between adjacent first via holes is not limited to about 500-1000 μm, and its value can be set according to actual needs.

Figure 5:
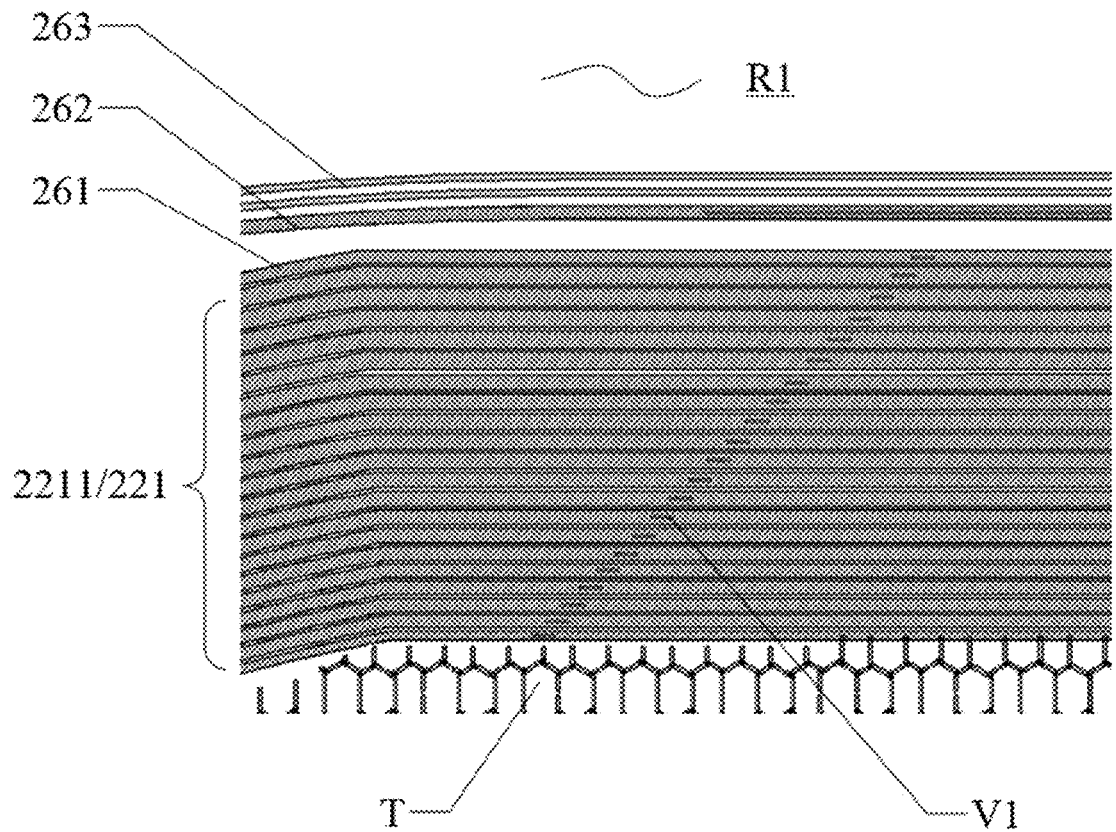
FIG. 5 is an enlarged structural diagram of region R1 in FIG. 2A.

For example, as illustrated in FIG. 5 and FIG. 8, each first via hole V1 is in the shape of a bar extending along the extending direction of the corresponding touch trace. For example, as illustrated in FIG. 5 and FIG. 8, the adjacent first via holes V1 located on different touch traces are arranged along a roughly oblique line, which intersects the X direction and the Y direction, respectively. This arrangement is beneficial to prevent static electricity from being generated between adjacent first via holes.

Figure 9:
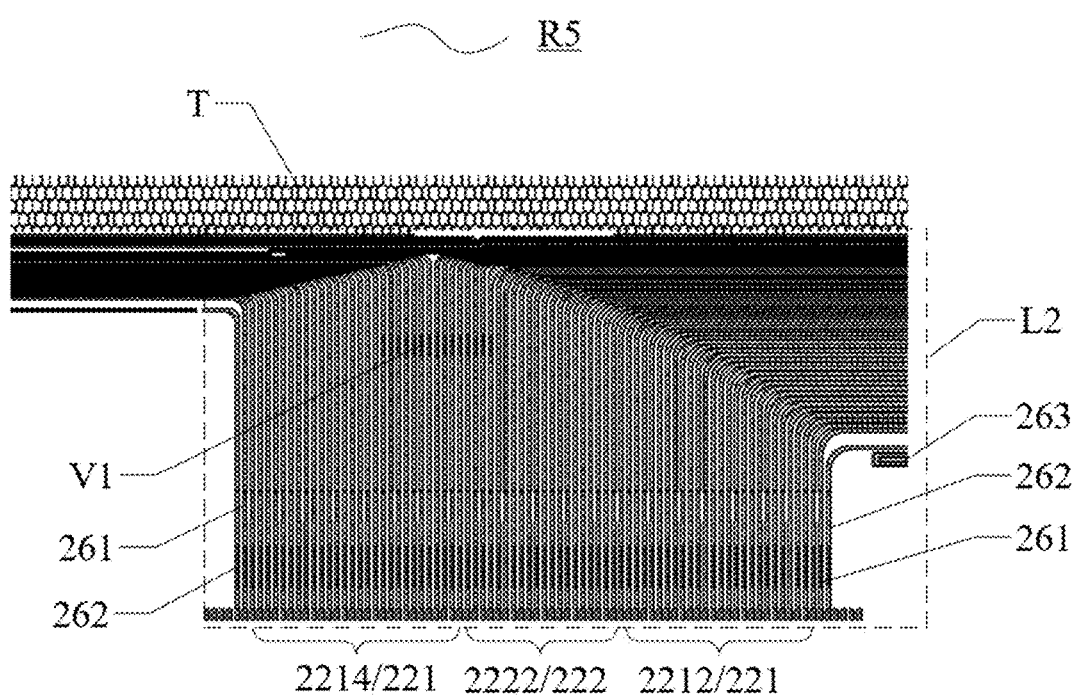
FIG. 9 is an enlarged structural diagram of region R5 in FIG. 2A.

For example, as illustrated in FIG. 9, for the first touch traces 221 and the second touch traces 222 located in the second trace convergence region L2, only a part of the first touch traces 221 and the second touch traces 222 are provided with the first via holes V1. In the second trace convergence region L2, the number and position of the first via holes V1 can be set according to the spatial position of the touch traces, which is not limited in this disclosure.

Figure 6:
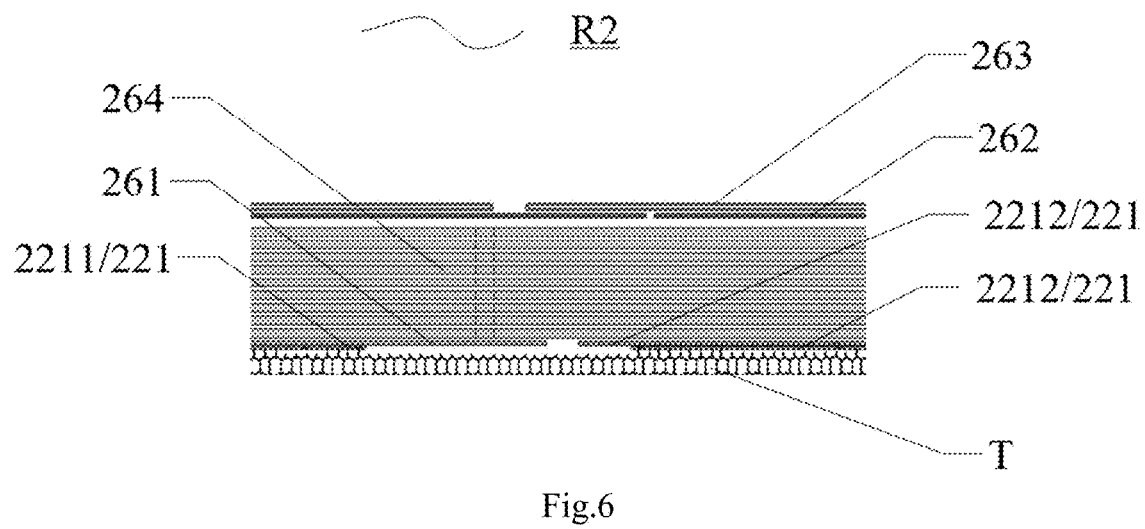
FIG. 6 is an enlarged structural diagram of region R2 in FIG. 2A.

It should be noted that, in FIG. 6, the first trace group 2211 and the second trace group 2212 respectively include only one first touch trace 221, which does not mean that there is only one trace in the first trace group 2211 and the second trace group 2212 at the first edge T1, but because along the direction parallel to the first edge T1, the ends of a plurality of first touch traces 221 near the middle of the first edge T1 have certain dislocation, and R2 is the approximate middle position of the first edge T1, so only one first touch trace 221 is illustrated here.

For example, as illustrated in FIG. 5-FIG. 9, the touch structure 20 further includes a shielding line 261, which is located on the side of the first touch traces 221 and the second touch traces 222 away from the touch region T. For example, the shielding line 261 is arranged around the first touch traces 221 and the second touch traces 222 and is close to the outermost sides of the first touch traces 221 and the second touch traces 222. The shielding line can shield the external signal interference to the first touch traces and the second touch traces, thereby improving the touch performance.

For example, as illustrated in FIG. 5-FIG. 9, the touch structure further includes a ground line 262, which is located on the side of the shielding line 261 away from the touch region T. For example, the ground line 262 is disposed around the first touch traces 221 and the second touch traces 222. For example, a plurality of ground lines 262 may be provided. For example, in the touch display device including the touch structure 20, the ground line may be connected to the circuit board located in the bonding region. The ground line can shield the signal interference of external static electricity to the first touch traces and the second touch traces, thereby improving the touch performance.

Figure 7:
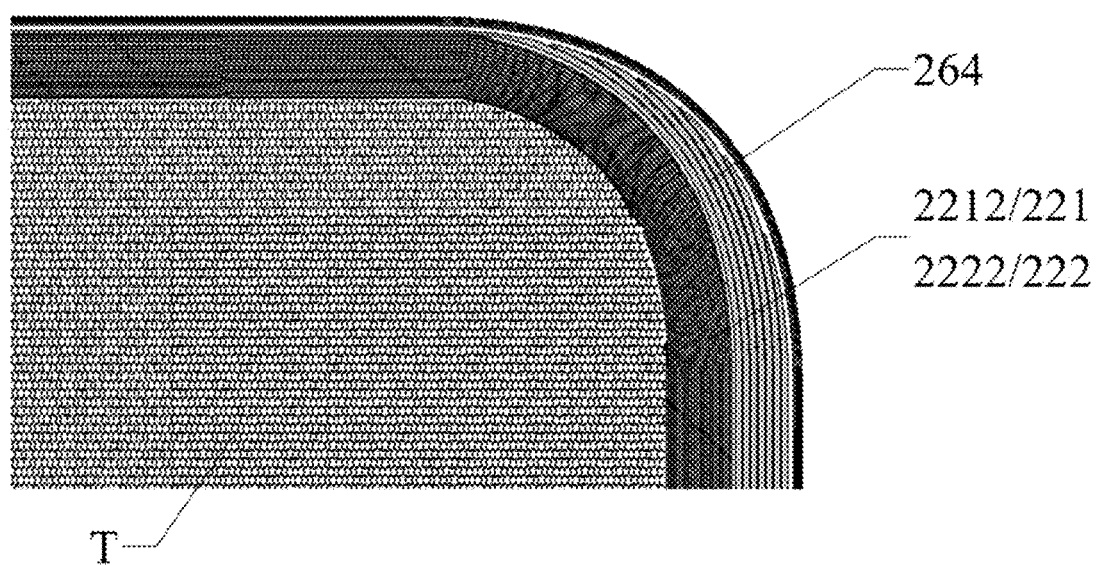
FIG. 7 is an enlarged structural diagram of region R3 in FIG. 2A.

For example, as illustrated in FIG. 6 and FIG. 7, the touch structure further includes a dummy line 264. The dummy line 264 may be arranged in a region where there is no metal trace.

An embodiment of the present disclosure also provides a touch display substrate. The touch display substrate includes the touch structure 20 provided in any of the above embodiments, and a display substrate 30. The display substrate includes a display region A and a peripheral region P surrounding the display region A. The display region A coincides with the touch region T of the touch structure 20, and the peripheral region P coincides with the peripheral region P of the touch structure 20.

Figure 10:
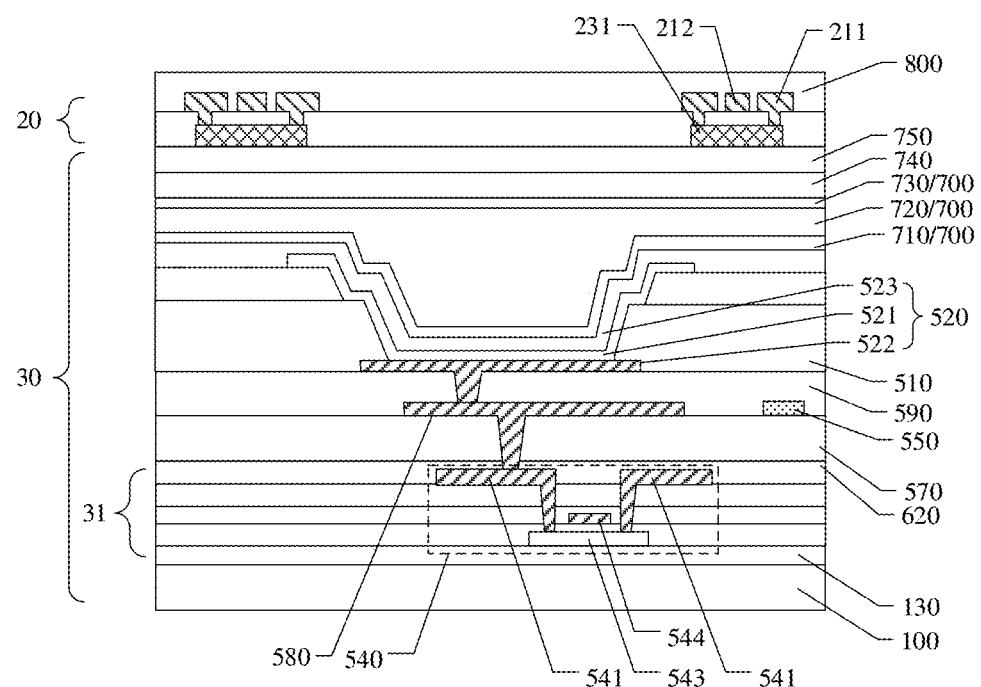
FIG. 10 is a cross-sectional structural diagram of a display region of a touch display substrate according to an embodiment of the present disclosure.

FIG. 10 is a cross-sectional structural diagram of the display region of a touch display substrate. For example, as illustrated in FIG. 10, the display substrate 30 includes at least one organic light emitting element 520 and an encapsulation layer 700, and the touch structure 20 is formed on the encapsulation layer 700.

In the organic light emitting diode (OLED) touch display substrate, the display substrate and the touch structure can be integrated together. Therefore, Flexible Multiple Layer on Cell (FMLOC) touch technology came into being. FMLOC touch technology is to directly manufacture various electrode layers and various traces of touch structure on the encapsulation layer, so as to integrate the touch structure on the display substrate. Therefore, the display device adopting FMLOC touch technology can not only realize the thinness of the display device, but also realize the touch function based on flexible display. For example, the touch display substrate provided by the embodiment of the present disclosure includes FMLOC touch technology.

As illustrated in FIG. 10, the display substrate 30 includes a base substrate 100, which may be a flexible substrate, for example, Polyimide (PI), but is not limited thereto.

For example, as illustrated in FIG. 10, each organic light emitting element 520 has a corresponding switching element 540 to control the organic light emitting element 520 to be turned on or off.

For example, as illustrated in FIG. 10, the switching element 540 is a thin film transistor 540 located in a pixel driving circuit layer 31. The thin film transistor 540 includes an active layer 543 on the base substrate 100, a gate electrode 544 on the side of the active layer 543 away from the base substrate 100, and a source/drain electrode 541 on the side of the gate electrode 544 away from the base substrate.

For example, as illustrated in FIG. 10, the display substrate 30 further includes a connecting electrode 580. The connecting electrode is located between the thin film transistor and the light emitting element, and is electrically connected with the drain electrode of the thin film transistor and the light emitting element, respectively.

For example, as illustrated in FIG. 10, the display substrate 30 further includes a power line 550, which is electrically connected to an anode 522 or a cathode 523, and is used to provide a driving voltage for the electroluminescent layer. For example, the power line 550 may be located on the same layer as the connecting electrode 580.

For example, as illustrated in FIG. 10, the organic light emitting element 520 is located on a side of the thin film transistor 540 away from the base substrate 100. Each organic light emitting element 520 includes an anode 522, an electroluminescent layer 521 and a cathode 523 which are stacked in the direction perpendicular to the substrate. The electroluminescent layer 521 is located between the anode 522 and the cathode 523 and can emit light under the joint action of the anode and the cathode. For example, the anodes 522 of the light emitting elements are insulated from one another. The cathodes 523 of the light emitting elements are connected to each other to form a continuous cathode layer. For example, the anode 522 can be used as a pixel electrode, so that the brightness of each light emitting element can be independently controlled for displaying.

For example, as illustrated in FIG. 10, the first touch electrode 211 and the second touch electrode 212 at least partially overlap the cathode 523 in the direction perpendicular to the substrate. In this case, the cathode 523 can shield the signal interference of the pixel driving circuit layer 31 to the touch electrode, so as to improve the touch performance.

For example, as illustrated in FIG. 10, the active layer of the thin film transistor 540 includes a source region, a drain region and a channel region located between the source region and the drain region. The thin film transistor 540 includes a source electrode and a drain electrode 541, which are electrically connected to the source region and drain region through via holes, respectively. The gate electrode overlaps with the channel region between the source region and the drain region in the active layer in the direction perpendicular to the base substrate 100.

For example, as illustrated in FIG. 10, the display substrate 30 further includes a first planarization layer 570, which is located above the source/drain electrodes 541 and is used to planarize the surface of the thin film transistor at the side away from the substrate. A connecting electrode 580 is formed on the first planarization layer 570, and the connecting electrode 580 overlaps the anode 522 in the direction perpendicular to the substrate.

For example, as illustrated in FIG. 10, the display substrate 30 further includes a second planarization layer 590, which is located between the anode 522 and the connecting electrode 580 and is used to planarize the surface of the connecting electrode 580 at the side away from the substrate. The connecting electrode 580 is electrically connected with the source/drain electrode 541 through via holes, and the anode 522 is electrically connected with the connecting electrode 580 through via holes, so that the anode 522 is electrically connected with the source/drain electrode 541. The connecting electrode can avoid directly forming a through via hole with a relatively large diameter in the first planarization layer and the second planarization layer, thereby improving the quality of electrical connecting of the via hole.

For example, as illustrated in FIG. 10, the display substrate 30 further includes a first buffer layer 130 between the base substrate 100 and the active layer 543. The display substrate also includes a passivation layer 620 between the first planarization layer 570 and the source/drain electrode 541.

In some embodiments, the display substrate 30 may not include the connecting electrode 580 and the second planarization layer 590, and the anode 522 and the source/drain electrode 541 are electrically connected through via holes. In some embodiments, the display substrate 30 may not include the passivation layer 620.

For example, the material of the anode 522 may include at least one transparent conductive oxide material, including indium tin oxide (ITO), indium zinc oxide (IZO), zinc oxide (ZnO) and the like. In addition, the anode 522 may include a metal with high reflectivity as a reflective layer, such as silver (Ag).

For example, the material of the electroluminescent layer 521 may include a small molecular organic material or a polymer molecular organic material, may be a fluorescent luminescent material or a phosphorescent luminescent material, and may emit red light, green light, blue light or white light; in addition, the electroluminescent layer may further include functional layers, such as an electron injection layer, an electron transporting layer, a hole injection layer, a hole transporting layer and the like according to needs.

For example, the cathode 523 may include various conductive materials. For example, the cathode 523 may include metal materials such as lithium (Li), aluminum (Al), magnesium (Mg) and silver (Ag).

For example, as illustrated in FIG. 10, the display substrate 30 further includes an encapsulation layer 700 covering the organic light emitting elements 520. The encapsulation layer 700 seals the organic light emitting element 520, so that the degradation of the organic light emitting element 520 caused by moisture or oxygen included in the environment can be reduced or prevented. The encapsulation layer 700 may be a single layer structure or a composite layer structure. The composite layer structure includes a structure in which inorganic layers and organic layers are stacked. For example, as illustrated in FIG. 10, the encapsulation layer 700 includes a first inorganic encapsulation layer 710, an organic encapsulation layer 720, and a second inorganic encapsulation layer 730 which are sequentially stacked.

For example, the materials of the first inorganic encapsulation layer and the second inorganic encapsulation layer may include insulating materials such as silicon nitride, silicon oxide, silicon oxynitride and polymer resin. Inorganic materials such as silicon nitride, silicon oxide, silicon oxynitride have high compactness, which can prevent the intrusion of water and oxygen. The material of the organic packaging layer may be polymer material containing desiccant or polymer material that can block water vapor, such as polymer resin or the like. For example, polymer resin can be used to flatten the surface of the display substrate, and relieve the stress of the first inorganic encapsulation layer and the second inorganic encapsulation layer, and water-absorbent materials such as desiccant can be included to absorb water, oxygen and other substances invading the inside.

For example, the first inorganic encapsulation layer and the second inorganic encapsulation layer can be manufactured by Chemical Vapor Deposition (CVD), and the organic encapsulation layer can be manufactured by ink jet printing (IJP).

For example, as illustrated in FIG. 10, the display substrate 30 further includes a second buffer layer 740, which is located on the side of the second inorganic encapsulation layer 730 away from the base substrate 100.

For example, as illustrated in FIG. 10, the display substrate further includes an insulating layer 750 located on the side of the second buffer layer 740 away from the base substrate 100. For example, the insulating layer 750 may be a silicon nitride layer. The insulating layer 750 can play a planarization role. In some embodiments, the display substrate does not include the insulating layer 750.

For example, as illustrated in FIG. 10, the display substrate further includes a protective layer 800, which is located on the side of the touch structure 20 away from the base substrate 100. The protective layer 800 can protect the touch structure 20.

It should be noted that the structure of the display substrate described above with reference to FIG. 10 is exemplary, and the touch structure of the embodiment of the present disclosure can be formed on any suitable type of display substrate to form a touch display substrate.

Figure 11:
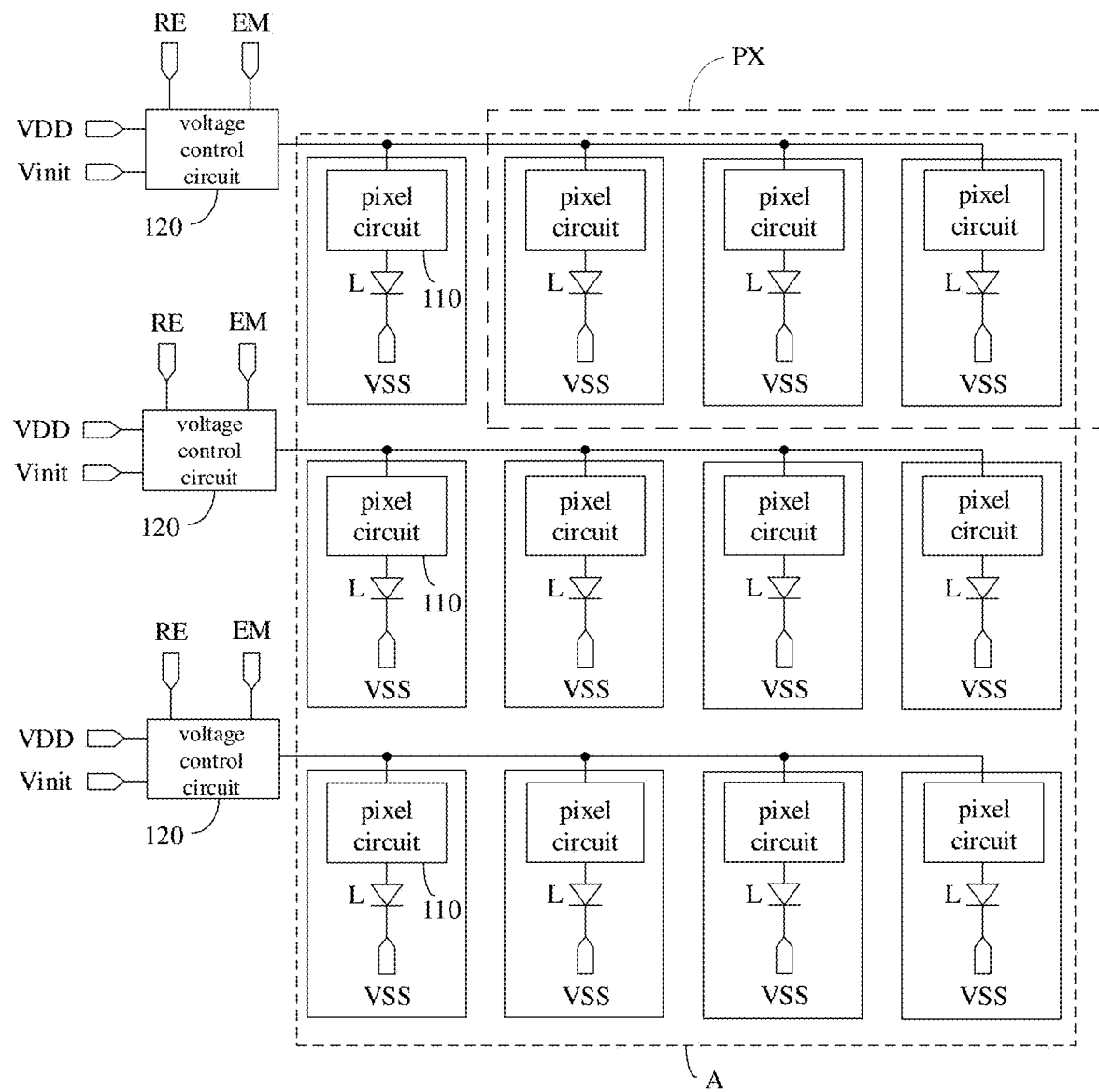
FIG. 11 is a schematic circuit diagram of a display substrate according to an embodiment of the present disclosure.

FIG. 11 is a schematic circuit diagram of a display substrate. As illustrated in FIG. 11, the display substrate 30 includes a plurality of display devices L (i.e., organic light emitting elements 520 in FIG. 10) located in a display region A, and pixel circuits 110 coupled with the respective display devices L in one-to-one correspondence, and the pixel circuits 110 include driving transistors. The display substrate may further include a plurality of voltage control circuits 120 located in the peripheral region P. For example, at least two pixel circuits 110 in a row share one voltage control circuit 120, and the first electrodes of the driving transistors in a row of pixel circuits 110 are coupled with the shared voltage control circuit 120, and the second electrode of each driving transistor are coupled with the corresponding display device L. The voltage control circuit 120 is configured to output the initialization signal Vinit to the first electrode of the driving transistor in response to the reset control signal RE, and control the corresponding display device L to be reset; and in response to the light emission control signal EM, outputting the first power signal VDD to the first electrode of the driving transistor to drive the display device L to emit light. The display substrate may further include a second power signal VSS located in the display region for inputting the second power signal to the display device L. It should be noted that the reset control signal RE corresponding to each voltage control circuit 120 is not completely the same, and the light emission control signal EM corresponding to each voltage control circuit 120 is not completely the same. By sharing the voltage control circuit 120, the structure of each pixel circuit in the display region A can be simplified, and the occupied region of the pixel circuit in the display region A can be reduced, so that the display region A can be provided with more pixel circuits and display devices, and an organic light-emitting display substrate with high PPI can be realized. In addition, under the control of the reset control signal RE, the voltage control circuit 120 outputs the initialization signal Vinit to the first electrode of the driving transistor, and controls the corresponding display device to reset, thus avoiding the influence of the voltage applied to the display device in the previous frame on the light emission of the next frame, and further improving the afterimage phenomenon.

For example, with reference to FIG. 10 and FIG. 11, the first power signal VDD is transmitted to the anode 522 of the organic light emitting element 520 through the drain electrode 541 of the thin film transistor 540 illustrated in FIG. 10, and the second power signal VSS is transmitted to the cathode 523 of the organic light emitting element 520 through the power line 550 illustrated in FIG. 10.

Figure 12:
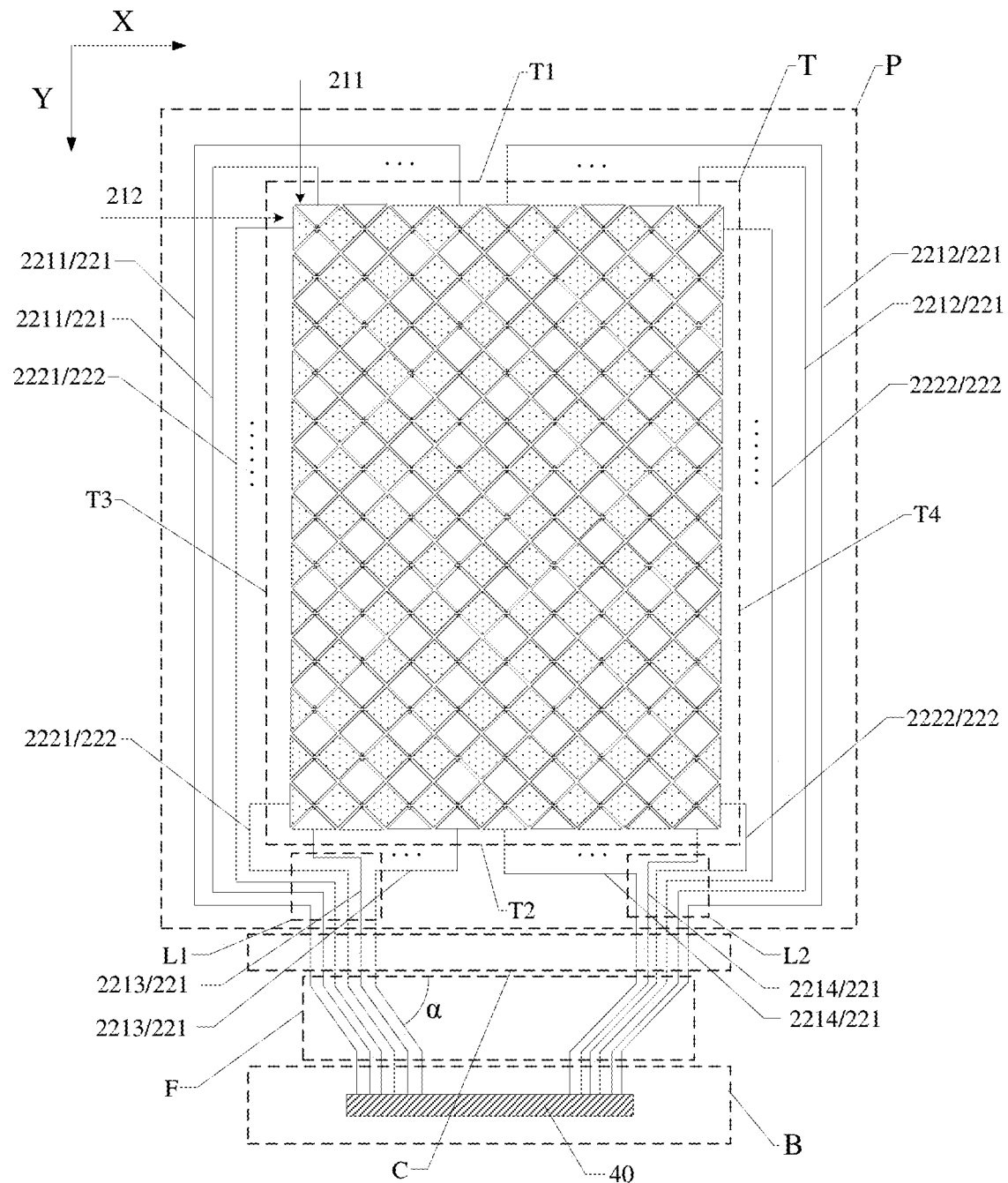
FIG. 12 is a schematic plan view of a touch display substrate according to an embodiment of the present disclosure.

FIG. 12 is a schematic plan view of a touch display substrate. As illustrated in FIG. 12, the touch display substrate further includes a bonding region B, which is located on the side of the second edge T2 away from the touch region T. The first touch traces 221 and the second touch traces 222 are connected to the bonding region B after converging in the first trace convergence region L1 and the second trace convergence region L2, respectively.

For example, as illustrated in FIG. 12, the bonding region B includes a touch driving chip 40. The first touch traces 221 and the second touch traces 222 are connected to the touch driving chip 40 located in the bonding region B. For example, the touch driving chip 40 includes a plurality of pins, each pin can correspond to a contact pad, and the first touch traces 221 and the second touch traces 222 are connected to the touch driving chip 40 through the contact pads.

For example, as illustrated in FIG. 12, the touch display substrate is a flexible display substrate, and further includes a bendable region C located between the touch region T and the bonding region B, or the bendable region C is located between the first trace convergence region L1 and the bonding region B in the Y direction, and between the second trace convergence region L2 and the bonding region B in the Y direction.

For example, as illustrated in FIG. 12, the touch display substrate further includes a trace transition region F, which is located between the bendable region C and the bonding region B. For example, the trace direction of first touch traces 221 and second touch traces 222 may have a certain change in the trace transition region F, so as to be connected with the pins of the touch driving chip 40 located in the bonding region. For example, in the trace transition region F, the included angle α between the X direction and the extending direction of the first touch traces 221 and the second touch traces 222 is both related to the size of the touch display substrate along the X direction, the size of the touch driving chip 40 and its relative position with the touch display substrate. For example, in one example, the value range of the included angle α is 30°-90°.

Figure 13:
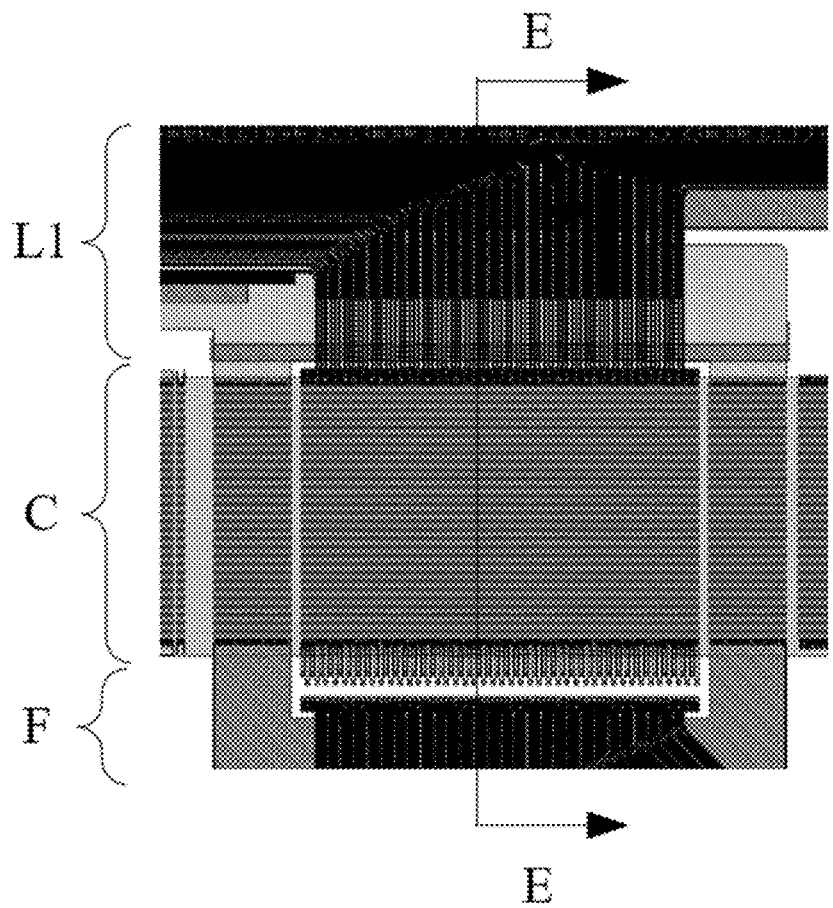
FIG. 13 is a partially enlarged schematic diagram of the bendable region C in FIG. 12.
Figure 14:
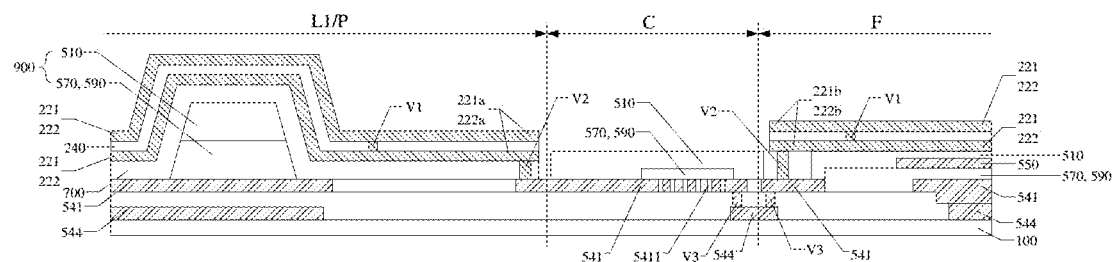
FIG. 14 is a cross-sectional structural diagram of the bendable region C of the touch display substrate along the direction E-E in FIG. 13.

FIG. 13 is a partially enlarged schematic diagram of the bendable region C, and FIG. 14 is a cross-sectional structural diagram of the bendable region C of the touch display substrate along the direction E-E in FIG. 13. As illustrated in FIG. 14, the bendable region C does not include the first touch trace 221 and the second touch trace 222, or the first touch trace 221 and the second touch trace 222 are disconnected at the bendable region C. For example, as illustrated in FIG. 14, the first touch trace 221 is disconnected at the bendable region C, forming a first end 221a near the touch region T and a second end 221b near the bonding region B; and the second touch trace 222 is disconnected at the bendable region C, forming a first end 222a near the touch region T and a second end 222b near the bonding region B. The bendable region C includes a first metal connecting portion 541 located at different layers from the first touch trace 221 and the second touch trace 222 and a second via hole V2, and the first metal connecting portion 541 includes a plurality of metal traces. The first end 221a of each first touch trace 221 and the first end 222a of each second touch trace 222 are electrically connected to one metal trace of the first metal connecting portion 541 through the second via hole V2 on the side of the bendable region C close to the touch region T (that is to say, the side close to the first trace convergence region L1), respectively, and the second end 221b of each first touch trace 221 and the second end 222b of each second touch trace 222 are electrically connected to one metal trace of the first metal connecting portion 541 through the second via hole V2 on the side of the bendable region C close to the bonding region B, respectively.

FIG. 14 illustrates that the conductive traces of two layers of the first touch trace 221 have the same length at the first end 221a and the second end 221b, and the second via hole V2 is electrically connected with the conductive traces located at the lower layer. However, FIG. 14 is only an example, and the embodiments of the present disclosure are not limited thereto. For example, as illustrated in FIG. 15, at the first end 221a and the second end 221b of the first touch trace 221, the upper conductive trace of the first touch trace 221 exceeds the lower conductive trace, and the second via hole V2 is electrically connected with the upper conductive trace.

Stress concentration will be generated in the bendable region C during bending. With this arrangement, the first touch trace 221 and the second touch trace 222 are prevented from being arranged in the bendable region C, thus preventing the first touch trace 221 and the second touch trace 222 from breaking in the bendable region C, and improving the touch stability of the touch display substrate.

Figure 15:
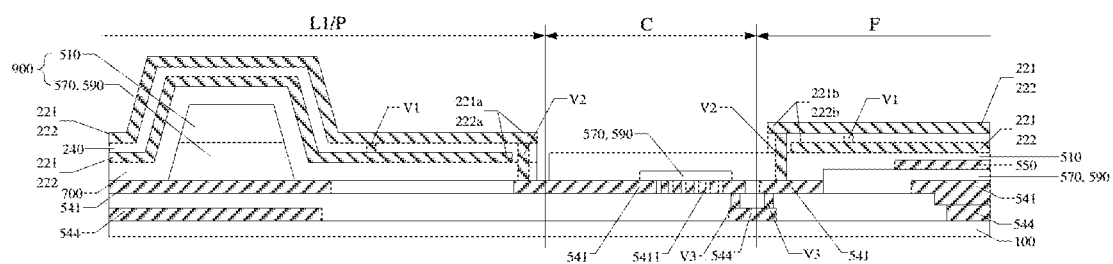
FIG. 15 is a cross-sectional structure diagram of the bendable region C of another touch display substrate along the direction E-E in FIG. 13.

For example, FIG. 14 and FIG. 15 illustrate that the touch display substrate further includes a dam 900, which is arranged in the peripheral region P. For example, the dam 900 may be formed by superimposing the first planarization layer 570, the second planarization layer 590, the pixel defining layer 510 and other film layers illustrated in FIG. 10. The dam 900 can be arranged around the touch region T (i.e., the display region), and plays a role in blocking the outflow of organic light emitting materials in the display region. The first touch trace 221 and the second touch trace 222 can cross the dam 900 from the touch region T and be connected to the bendable region C.

For example, as illustrated in FIG. 14 and FIG. 15, the first metal connecting portion 541 is located on the same layer as the source/drain electrode 541 of the thin film transistor, but the first metal connecting portion 541 is not connected to the source/drain electrode 541 of the thin film transistor. Therefore, the number of metal layers of the touch display substrate can be reduced, thereby saving the manufacturing process.

For example, the bendable region C includes a second metal connecting portion 544 which are located at different layers from the first metal connecting portion 541 and a third via hole V3. For example, the second metal connecting portion 544 is located on the same layer as the gate electrode 544 of the thin film transistor, but the second metal connecting portion 544 is not connected to the gate electrode 544 of the thin film transistor. As illustrated in FIG. 14, in the bendable region C, the first metal connecting portion 541 is disconnected into two parts at the position corresponding to the second metal connecting portion 544, and the disconnected two parts of the first metal connecting portion 541 are electrically connected with the second metal connecting portion 544 through the third via hole V3, respectively. For example, the second metal connecting portion 544 also includes a plurality of metal traces, and the metal traces of the second metal connecting portion 544 are electrically connected with the metal traces of the first metal connecting portion 541 in one-to-one correspondence. With this arrangement, the stress concentration in the bendable region C can be reduced, thereby prolonging the service life of the touch display substrate.

For example, as illustrated in FIG. 14 and FIG. 15, the first metal connecting portion 541 includes an opening 5411 along the direction perpendicular to the layer of the first metal connecting portion 541. By setting the opening 5411 in the first metal connecting portion 541, the thickness of the first metal connecting portion 541 located in the bendable region C can be reduced, thus further reducing the stress concentration in the bendable region C and prolonging the service life of the touch display substrate.

As illustrated in FIG. 14 and FIG. 15, at least a part of the power line 550 of the touch display substrate is located in the trace transition region F. In the direction perpendicular to the substrate 100, the first touch trace 221 and the second touch trace 222 overlap with at least a part of the power line 550 located in the trace transition region F. With this arrangement, the signal interference from the pixel driving circuit layer can be reduced through the power line 550, thereby improving the touch performance of the touch display substrate.

For example, as illustrated in FIG. 5, FIG. 6, FIG. 8 and FIG. 9, the touch display substrate further includes a detection line 263, which is located on the side of the ground line 262 away from the touch region T. For example, the detection line 263 is arranged around the first touch trace 221 and the second touch trace 222. The detection line can be connected to the circuit board located in the bonding region. The detection line is used for detecting cracks generated by the touch display substrate.

An embodiment of the present disclosure further provides a touch display device, including the touch display substrate provided by any of the above embodiments.

In the disclosed embodiment, the touch display device includes an FMLOC touch display substrate, but it is not limited to this. The touch display device can be display devices such as liquid crystal display, electronic paper, organic light-emitting diode (OLED) display, and any products or components with touch and display functions such as televisions, digital cameras, mobile phones, watches, tablet computers, notebook computers, and navigators including these display devices.

An embodiment of the present disclosure also provides a manufacturing method of the touch structure as illustrated in FIG. 2A. Referring to FIG. 2A and FIG. 4, the manufacturing method includes forming a touch structure 20 on a substrate 101. The touch structure 20 includes a touch region T and a peripheral region P surrounding the touch region T. The touch region T includes a first edge T1 and a second edge T2 opposite to each other, and a third edge T3 and a fourth edge T4 opposite to each other. The touch structure 20 further includes a first touch electrode 211 and a second touch electrode 212 which are mutually crossed with and insulated from each other, and are located in the touch region T. The touch structure 20 further includes a first touch trace 221 and a second touch trace 222, which are located in the peripheral region P. The first touch trace 221 is connected to the first touch electrode 211 at the first edge T1 and the second edge T2, respectively. The second touch trace 222 is connected to the second touch electrode 212 at the third edge T3 and the fourth edge T4, respectively.

For example, in some examples, both the first touch trace 221 and the second touch trace 222 of the touch structure 20 include two layers of conductive traces, the two layers of conductive traces of the first touch trace 221 overlap each other and are electrically connected, and the two layers of conductive traces of the second touch trace 222 overlap each other and are electrically connected.

In this case, forming the touch structure 20 on the substrate 101 includes the following steps.

S10: forming a bridge layer 230 on the substrate 101. The bridge layer 230 includes a bridge line 231 and a layer of conductive trace of the first touch trace 221 and the second touch trace 222.

S20: forming an interlayer dielectric layer 240 on the bridge layer 230. The interlayer dielectric layer 240 includes a plurality of first via holes V1.

S30: forming a touch mesh layer 210 on the interlayer dielectric layer 240. The touch mesh layer 210 includes mesh patterns of the first touch electrode 211 and the second touch electrode 212, and another layer of conductive trace of the first touch trace 221 and the second touch trace 222. The mesh pattern 2110 of the first touch electrode 211 or the mesh pattern 2120 of the second touch electrode 212 are electrically connected by the bridge line 231, the conductive traces of the two layers of first touch traces 221 are electrically connected by the first via holes V1, and the conductive traces of the two layers of second touch traces 222 are electrically connected by the first via holes V1.

For example, for an OLED touch display substrate as illustrated in FIG. 10, the substrate 101 may be an encapsulation layer 700.

It should be noted that the formation order of the bridge layer 230 and the touch mesh layer 210 can be reversed, that is to say, the bridge layer 230 can be formed on the substrate 101 after the touch mesh layer 210 is formed on the substrate 101.

For example, referring to FIG. 10, the above manufacturing method further includes forming an insulating layer 750 on the substrate 101 before forming the bridge layer 230 on the substrate 101.

For example, referring to FIG. 10, the above manufacturing method further includes forming a protective layer 800 on the touch mesh layer 210.

The manufacturing method of the touch structure provided by the embodiments of the disclosure can be used for manufacturing the touch structure provided by any of the above embodiments.

The following statements should be noted:
(1) The accompanying drawings related to the embodiment(s) of the present disclosure involve only the structure(s) in connection with the embodiment(s) of the present disclosure, and other structure(s) can be referred to common design(s).
(2) In case of no conflict, features in one embodiment or in different embodiments of the present disclosure can be combined to obtain new embodiments.

The above is only the specific embodiments of the disclosure, but the scope of protection of the disclosure is not limited thereto. Those skilled in the art can easily conceive changes or substitutions within the scope of the disclosure, which should be covered by the scope of protection of the disclosure. Therefore, the protection scope of the present disclosure shall be subject to the protection scope of the claims.

What is claimed is:

1. A touch structure, comprising:
a touch region and a peripheral region surrounding the touch region, wherein the touch region comprises a first edge and a second edge opposite to each other, and a third edge and a fourth edge opposite to each other;
a first touch electrode and a second touch electrode, which are mutually crossed with and insulated from each other, and located in the touch region;
a first touch trace and a second touch trace, located in the peripheral region; and
a shielding line, which is located at a side of the first touch trace and the second touch trace away from the touch region,
wherein the first touch trace is electrically connected with the first touch electrode at the first edge and the second edge, respectively; the second touch trace is electrically connected with the second touch electrode at the third edge and the fourth edge, respectively.

2. The touch structure according to claim 1, further comprising:
a first trace convergence region and a second trace convergence region,
wherein the first trace convergence region and the second trace convergence region are located on a side of the second edge away from the first edge, and in an extending direction of the second edge, the first trace convergence region and the second trace convergence region are located between the third edge and the fourth edge, and the second trace convergence region is located on a side of the first trace convergence region away from the third edge, and a part of the first touch trace and a part of the second touch trace extend to the first trace convergence region, and another part of the first touch trace and another part of the second touch trace extend to the second trace convergence region.

3. The touch structure according to claim 2, wherein the first touch trace comprises:

a first trace group and a second trace group connected to the first touch electrode at the first edge, the first trace group and the second trace group being separated at a roughly middle position of the first edge, and the first trace group extending from a side of the third edge to the first trace convergence region; the second trace group extending from a side of the fourth edge to the second trace convergence region; and a third trace group and a fourth trace group connected to the first touch electrode at the second edge, the third trace group and the fourth trace group being separated at a roughly middle position of the second edge, and the third trace group extending to the first trace convergence region; the fourth trace group extending to the second trace convergence region.

4. The touch structure according to claim 3, wherein the second touch trace comprises:

a fifth trace group connected to the second touch electrode at the third edge, the fifth trace group extending from a side of the third edge to the first trace convergence region; and a sixth trace group connected to the second touch electrode at the fourth edge, the sixth trace group extending from a side of the fourth edge to the second trace convergence region.

5. The touch structure according to claim 4, wherein the fifth trace group is located between the first trace group and the third trace group in the first trace convergence region; the sixth trace group is located between the second trace group and the fourth trace group in the second trace convergence region.

6. The touch structure according to claim 1, wherein both the first touch trace and the second touch trace comprise two layers of conductive traces, the two layers of conductive traces of the first touch trace overlap and are electrically connected with each other, and the two layers of conductive traces of the second touch trace overlap and are electrically connected with each other.

7. The touch structure according to claim 6, further comprising an interlayer dielectric layer located between the two layers of conductive traces of the first touch trace and located between the two layers of conductive traces of the second touch trace, wherein the interlayer dielectric layer comprises a plurality of first via holes, the two layers of conductive traces of the first touch trace are electrically connected through the first via holes, and the two layers of conductive traces of the second touch trace are electrically connected through the first via holes.

8. The touch structure according to claim 7, wherein, in the extending direction of the first touch trace or the second touch trace, the first via holes between the two layers of conductive traces of the first touch trace are arranged at intervals, the first via holes between the two layers of conductive traces of the second touch trace are arranged at intervals.

9. The touch structure according to claim 8, wherein, in the extending direction of the first touch trace or the second touch trace, a distance between adjacent first via holes between the two layers of conductive traces of the first touch trace is about 500-1000 μm, and a distance between adjacent first via holes between the two layers of conductive traces of the second touch trace is about 500-1000 μm.

10. The touch structure according to claim 7, wherein the first touch electrode and the second touch electrode comprise mesh patterns in a touch mesh layer and a bridge line in a bridge layer, and the bridge line is configured to electrically connect the mesh patterns of the first touch electrode or the mesh patterns of the second touch electrode at an intersection of the first touch electrode and the second touch electrode, one of the two layers of conductive traces of the first touch trace is located in the bridge layer, and the other is located in the touch mesh layer; one of the two layers of conductive traces of the second touch trace is located in the bridge layer, and the other is located in the touch mesh layer.

11. The touch structure according to claim 1, further comprising a ground line, which is located at a side of the shielding line away from the touch region.

12. A touch display substrate, comprising the touch structure according to claim 1, and a display substrate, wherein the display substrate comprises an organic light emitting element and an encapsulation layer, and the touch structure is located on the encapsulation layer.

13. The touch display substrate according to claim 12, further comprising a bonding region located on a side of the second edge away from the touch region, and the first touch trace and the second touch trace being connected to the bonding region.

14. The touch display substrate according to claim 13, further comprising a bendable region located between the touch region and the bonding region, wherein at least one of the first touch trace and the second touch trace is disconnected at the bendable region to form a first end close to the touch region and a second end close to the bonding region, and the bendable region comprises a first metal connecting portion which is located at different layer from the first touch trace and the second touch trace and a second via hole, and the first end and the second end are connected with the first metal connecting portion through the second via hole, respectively.

15. The touch display substrate according to claim 14, further comprising a pixel driving circuit layer, wherein the pixel driving circuit layer comprises a thin film transistor, the thin film transistor comprises a source/drain electrode and a gate electrode, and the first metal connecting portion and the source/drain electrode of the thin film transistor are located on a same layer.

16. The touch display substrate according to claim 15, wherein the bendable region comprises a second metal connecting portion which is located on different layer from the first metal connecting portion and a third via hole, the second metal connecting portion is located on the same layer as the gate electrode of the thin film transistor, and the first metal connecting portion is disconnected into two parts at a position corresponding to the second metal connecting portion in the bendable region, and the two parts of the first metal connecting portion are respectively connected with the second metal connecting portion through the third via hole.

17. The touch display substrate according to claim 14, wherein the first metal connecting portion comprises an opening along a direction perpendicular to a layer where the first metal connecting portion is located.

18. The touch display substrate according to claim 13, wherein the organic light emitting element comprises an anode, an electroluminescent layer and a cathode which are sequentially stacked, and the first touch electrode and the second touch electrode are at least partially overlapped with the cathode.

19. The touch display substrate according to claim 18, further comprising:

a trace transition region located between the bendable region and the bonding region;

a power line electrically connected with the anode or the cathode, at least part of the power line is located in the trace transition region, and the first touch trace and the second touch trace overlap with at least part of the power line located in the trace transition region.

20. A touch structure, comprising:

a touch region and a peripheral region surrounding the touch region, wherein the touch region comprises a first edge and a second edge opposite to each other, and a third edge and a fourth edge opposite to each other;

a first touch electrode and a second touch electrode, which are mutually crossed with and insulated from each other, and located in the touch region; and a first touch trace and a second touch trace, located in the peripheral region, wherein the first touch trace is electrically connected with the first touch electrode at the first edge and the second edge, respectively; the second touch trace is electrically connected with the second touch electrode at the third edge and the fourth edge, respectively, wherein both the first touch trace and the second touch trace comprise two layers of conductive traces, the two layers of conductive traces of the first touch trace overlap and are electrically connected with each other, and the two layers of conductive traces of the second touch trace overlap and are electrically connected with each other, wherein the touch structure further comprises an interlayer dielectric layer located between the two layers of conductive traces of the first touch trace and located between the two layers of conductive traces of the second touch trace, wherein the interlayer dielectric layer comprises a plurality of first via holes, the two layers of conductive traces of the first touch trace are electrically connected through the first via holes, and the two layers of conductive traces of the second touch trace are electrically connected through the first via holes, wherein the first touch electrode and the second touch electrode comprise mesh patterns in a touch mesh layer and a bridge line in a bridge layer, and the bridge line is configured to electrically connect the mesh patterns of the first touch electrode or the mesh patterns of the second touch electrode at an intersection of the first touch electrode and the second touch electrode, one of the two layers of conductive traces of the first touch trace is located in the bridge layer, and the other is located in the touch mesh layer; one of the two layers of conductive traces of the second touch trace is located in the bridge layer, and the other is located in the touch mesh layer.

* * * * *